(12) United States Patent
Lablans

(10) Patent No.: US 7,397,690 B2
(45) Date of Patent: Jul. 8, 2008

(54) MULTI-VALUED DIGITAL INFORMATION RETAINING ELEMENTS AND MEMORY DEVICES

(75) Inventor: Peter Lablans, Morris Township, NJ (US)

(73) Assignee: Temarylogic LLC, Morristown, NJ (US)

( * ) Notice: Subject to any disclaimer, the term of this patent is extended or adjusted under 35 U.S.C. 154(b) by 333 days.

(21) Appl. No.: 11/139,835

(22) Filed: May 27, 2005

(65) Prior Publication Data

US 2005/0278661 A1    Dec. 15, 2005

Related U.S. Application Data

(60) Provisional application No. 60/599,781, filed on Aug. 7, 2004, provisional application No. 60/575,948, filed on Jun. 1, 2004.

(51) Int. Cl.
  *G11C 11/00*    (2006.01)
(52) U.S. Cl. .................. 365/154; 326/59; 365/189.08
(58) Field of Classification Search .......... 365/45, 365/168, 185.03, 15, 189.12, 154, 189.08; 326/46, 59–60, 56–58
See application file for complete search history.

(56) References Cited

U.S. PATENT DOCUMENTS

| | | | |
|---|---|---|---|
| 3,129,340 A | 4/1964 | Baskin | |
| 3,176,154 A | 3/1965 | Salter | |
| 3,207,922 A | 9/1965 | Gruodis et al. | |
| 3,671,763 A | 6/1972 | Maley et al. | |
| 3,671,764 A | 6/1972 | Maley et al. | |
| 3,909,634 A | 9/1975 | Maley et al. | |
| 4,107,549 A * | 8/1978 | Moufah | 326/59 |
| 4,378,595 A * | 3/1983 | Current | 365/45 |

(Continued)

OTHER PUBLICATIONS

Milan Petrik ; 'Design of Manny-Valued Logical Circuits', Czech Technical University, Prague, Czech Republic,Feb. 8, 2004, available on the Internet at: http://cmp.felk.cvut.cz/~petrikm/mvdesign/mvdesign.pdf.

(Continued)

*Primary Examiner*—Richard T. Elms
*Assistant Examiner*—Alexander Sofocleous
(74) *Attorney, Agent, or Firm*—Diehl Servilla LLC; Glen M. Diehl; Scott S. Servilla

(57) ABSTRACT

Discussed are models and methods to create stable binary and non-binary sequential devices including one or more logic functions of which an output signal is uniquely related to an input signal. Methods and apparatus for non-binary single independent input information retaining devices from two logic functions are discussed. Memory elements using the information retaining devices and methods are also discussed. Methods and apparatus for n-valued memory devices including n-valued inverters with feedback are discussed. Binary and non-binary information retaining elements with two logic functions and two independent inputs are discussed. Also discussed are n-valued gating devices that can be combined with n-valued information retaining devices to form n-valued memory devices. Methods and apparatus for single non-binary n-valued logic function latches are discussed. Single non-binary n-valued function methods realizing (n−1)-valued latching methods controlled by an nth state are also discussed. Two non-binary n-valued logic functions based memory devices retaining the value of a first input and controlled by a second input are discussed. Ternary, 4-valued and n-valued true latches are discussed.

16 Claims, 15 Drawing Sheets

U.S. PATENT DOCUMENTS

| | | | |
|---|---|---|---|
| 4,513,283 A | | 4/1985 | Leininger |
| 4,808,854 A | * | 2/1989 | Reinagel .................. 326/59 |
| 5,122,688 A | | 6/1992 | Grimes |
| 6,133,754 A | | 10/2000 | Olson |
| 6,191,977 B1 | | 2/2001 | Lee |
| 2002/0158663 A1 | | 10/2002 | Shemesh |

OTHER PUBLICATIONS

Ugur çilingiroglu, Yaman Özelçi; 'Multiple-Valued Static CMOS Memory Cell', IEEE Transactions on Circuits and Systems—II: Analog and Digital Signal Processing, vol. 48, No. 3, Mar. 2001, pp. 282-290.

Omid Mirmotahari, Yngvar Berg; 'A Novel D-Latch In Multiple-Valued Semi-Floating-Gate Recharged Logic', Proceedings of ISMVL '04, 4 pages.

Hanyu et al., 'A Floating-Gate-Mos-Based Multiple-Valued Associative Memory', Proc. IEEE International Symposium on Multiple-Valued Logic,21,(1991),24-31.

Alexey Stakhov, Brousentsov's Ternary Principle, Bergmans's Number System and Ternary Mirror-symmetrical Arithmetic, The Computer Journal, vol. 45, No. 2, 2002, 221-236.

Inaba et al., 'Multi-Valued Flip-Flop with Neuron-CMOS NMIN Circuits.', IEEE, Proceedings of the 32nd International Symposium on Multiple-Valued Logic (ISMVL'02), 7 pages.

* cited by examiner

MULTI-VALUED DIGITAL INFORMATION RETAINING ELEMENTS AND MEMORY DEVICES

STATEMENT OF RELATED CASES

This patent application claims the benefit of U.S. Provisional Patent Application No. 60/575,948, filed on Jun. 1, 2004, entitled MULTI-VALUE CODING OF SEQUENCES AND MULTI-VALUE MEMORY DEVICES and U.S. Provisional Patent Application No. 60/599,781, filed Aug. 7, 2004, entitled MULTI-VALUED DIGITAL INFORMATION RETAINING ELEMENTS AND MEMORY DEVICES, both of which are incorporated herein fully by reference.

BACKGROUND OF THE INVENTION

This invention relates to the retention of digital information in logic devices which can be applied as or in multi-valued digital memory elements. More specifically it relates to applying logical functions and their configurations to achieve digital information retaining effects.

The multi-valued digital memory elements can be applied in digital circuit applications where the temporary storage of multi-valued digital information is required.

There are known and different ways to retain binary digital information. There are known physical effects that put a material in one of two different physical states. A capacitor holding an electrical charge may represent a binary 1 state, while the capacitor without a certain electrical charge may represent a binary 0. Different magnetic states (such as applied in magnetic disk drives) are another example. Another example is the optical reflective state of a material such as applied in optical disks (such as CD-ROMs).

Other binary devices use logical effects. By applying binary logical functions in feedback configurations, the resulting (usually electronic) circuit retains information about its previous switching state or states. Binary flip-flops and latches are well known examples. The memory effect depends mainly on the applied logical functions.

The related art in binary digital electronic circuits comprises two classes of logic devices: combinational logic in which the output state of a logic device does not depend on its own previous state and sequential logic where the result can be influenced by its previous switching state. Binary logic memory devices such as flip-flops are sequential devices.

An n-valued digit (with n an integer greater than 2) has inherently more information content than a binary digit. Consequently a memory device that can retain an n-valued digit retains more information than a binary memory device.

Multi-valued sequential digital (memory) devices can also facilitate the usefulness of other multi-valued logic circuits.

Multi-valued logic based information retaining devices are not merely an extension of binary devices. There are currently no known general rules or methods to identify the non-binary multi-valued logic functions to create multi-valued information retaining devices. The switching model according to one aspect of the present invention will enable identifying the appropriate n-valued logic functions.

Consequently, new devices and methods to realize multi-valued information retention are required and new methods to create or identify the enabling logic functions are required.

SUMMARY OF THE INVENTION

In view of the more limited possibilities of the prior art in creating non-binary sequential devices, the current invention offers an improvement of the design and creation of n-valued devices including n-valued memory and sequential devices.

The general purpose of the present invention, which will be described subsequently in greater detail, is to provide methods of designing and testing of ternary, 4-valued and other multi-valued digital sequential devices as well as the devices themselves. Before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. The described information retaining devices are enabled by any switching mechanism that realizes the truth tables that are part of the invention. These switching mechanisms can be electronic, optical, mechanical, quantum-mechanical, molecular or of any other physical switching nature. Also, it is to be understood that the phraseology and terminology employed herein are for the purpose of the description and should not be regarded as limiting.

Multi-valued and n-valued in the context of this application mean a number n, with n being an integer greater than two. N-valued logic functions are assumed to have two input values and one output value determined by a truth table, usually presented in a n×n matrix form, with input values shown in an additional row on top of the matrix and one column to the left of the matrix.

An object of the present invention is to provide a new method for creating and testing multi-valued digital sequential and memory devices that will overcome the shortcomings of the prior art technology.

Another object of the present invention is to provide a method to create and test n-valued sequential devices from n-valued logic functions that achieve stable output states reflecting the input state and do not require more than one independent input.

Another object of the present invention is to provide a method to create and test n-valued sequential devices that are comprised of just one n-valued function and achieve stable output states reflecting the input state and do not require more than one independent input.

Another object of the present invention is to provide a method to create and test n-valued sequential devices that are comprised of just one n-valued function and achieve (n−1) stable output states reflecting (n−1) possible input states, and apply a $n^{th}$ state to retain information reflecting the previous state and do not require more than one independent input.

Another object of the present invention is to provide a method to create and test an n-valued sequential digital device, comprised of two n-valued functions with feedback, applying separate Data and Reset signals, that can retain the original n-valued Data information after the original Data signal has been removed.

Another object of the present invention is to create signal delay for an n-valued signal by applying at least two reversible n-valued logic inverters.

Another object of the present invention is to create an n-valued controlled gating device that passes on a first of two signals when the control signal is in one of two states and passes a second of two signals when the control signal is in the second of two states.

Another object of the present invention is to create an n-valued memory device from inverters with feedback and individually controlled gates.

Another object of the present invention is to create a controlled n-valued memory device that reads an n-valued signal for one value of a control signal and stores it on a second value of the control signal.

Another object of the present invention is to create an n-valued latch which retains the previous input states when a specific new set of input states is entered.

The single or two n-valued function devices described for illustrative purposes as part of this invention are in description and explanation focused on applying identical (in the case of 2 function devices) and commutative n-valued logic functions. The methods that are part of this invention and are applied for creating and testing the correct and stable n-valued single and two function devices will also enable non-commutative n-valued functions in those configurations. The methods can also be applied to design and test two function devices with different and non-commutative functions.

Inversion of logic states in binary logic is often associated with the perceived value of a binary symbol. The inventor has recognized that inversion of logic states (in particular in n-valued logic with n greater than 2) at the input and/or the output of a logic function is equivalent with transforming the functional behavior (or truth table). A method to apply rules of transformation is part of the invention. Consequently the application of n-valued logic inverters in combination with a logic function in effect creates a new equivalent logic function. This enables the reduction of the number of different devices in n-valued logic applications. The possibility to reduce functions that are combined with inverters is recognized. Inverters that are applied in the present invention have been left in for illustrative purpose. It is recognized that in certain cases circuits and diagrams may be reduced in component count by eliminating the inverters. However, as will be explained as one aspect of this invention, the use of inverters may be required to extend the delay time in circuits, rather than for logic reasons.

This invention addresses the shortcomings and limitations in present and prior information retaining devices.

BRIEF DESCRIPTION OF THE DRAWINGS

Various other objects, features and attendant advantages of the present invention will become fully appreciated as the same becomes better understood when considered in conjunction with the accompanying drawings, and wherein.

DETAILED DESCRIPTION OF THE INVENTION

One aspect of the present invention provides apparatus and methods for designing and realizing retaining information devices relating to multi-valued signals by applying multi-valued logic functions. Such multi-valued signals can assume one of x states wherein x is greater than or equal to three.

Method for Creating Two Function Stable Sequential Multi-valued Devices

In accordance with one aspect of the present invention, there are two n-valued logic function devices with feedback, such that a single n-valued signal is inputted and the output signal is directly related to the input in such a way that the value or state of the input signal can be derived from the output signal. Furthermore, the device provides a stable output signal. The stability criterion includes that initially the device may change states but should settle relatively quickly and in a limited number of settling cycles after the input signal was changed.

Figure 1:
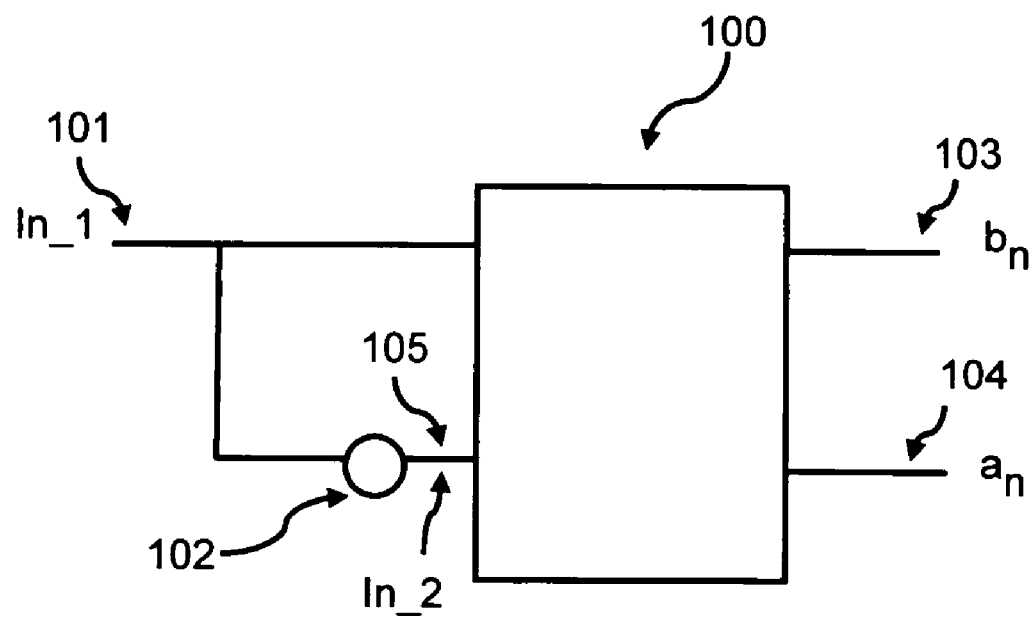
FIG. 1 is a block diagram of an n-valued information retaining device having a first independent input that provides an n-valued digital signal and a second input that provides a signal derived from the first input by way of a reversible inverter.

FIG. 1 shows a block diagram of a sequential device 100 in accordance with one aspect of the present invention. It has one input 101. Another input 105 is derived from the first input by applying a reversible inverter 102. The reversible inverter 102 converts the input in a manner disclosed in U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS which is hereby incorporated by reference. For example if 102 is a ternary reversible inverter, it may invert a 0 to a 1, a 1 to a 2 and a 2 to a 0. Other inverters are possible. Thus, the second input 105 to the latch 100 is not independent from the first input 101 to the latch 100.

Figure 2:
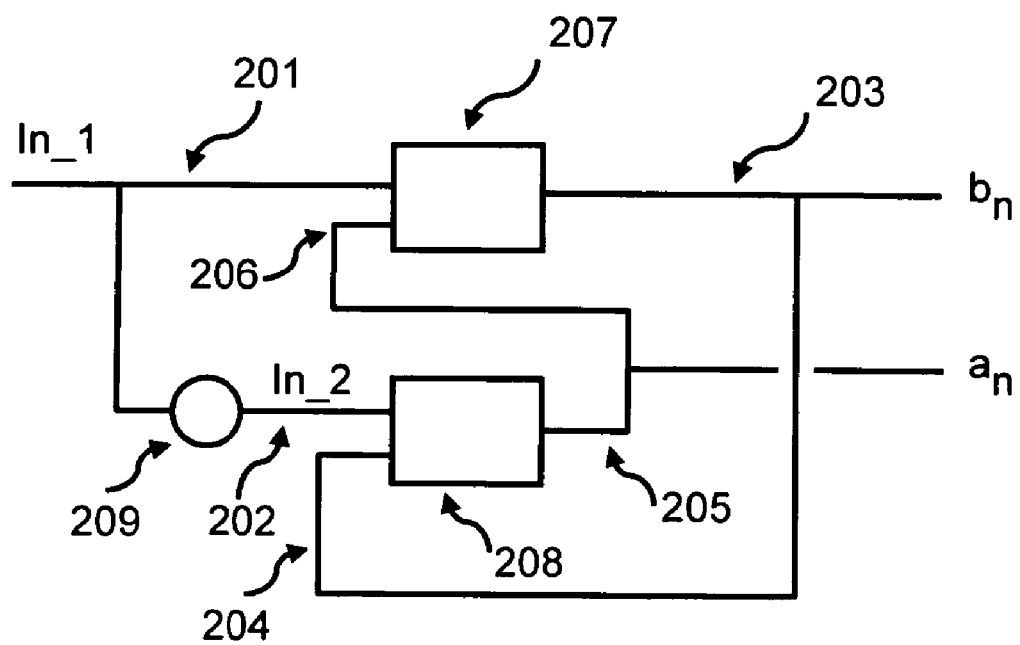
FIG. 2 shows a diagram of an n-valued information retaining device with a first independent input and a second derived input comprising two n-valued logic functions with feedback.

The device 100 in FIG. 1 functions as an information retaining device of which the details are shown in FIG. 2. The performance of the device depends on state feedback and locks on the input state. The output state of an information retaining device, after stabilization always represents the input state. The devices can be expanded in such a way that they retain their value even in absence of a signal and only change value at the occurrence of an event such as a clock pulse. In such case they are called memory devices. However, at the heart of all these memory circuits is the basic sequential logic mechanism, created by signal feedback.

FIG. 2 shows a generic configuration, in accordance with one aspect of the present invention that works as a stable 2 element, single input n-valued device. The device comprises two n-valued logic devices 207 and 208 that implement n-valued logic functions. These devices 207 and 208 can realize the device from FIG. 1. The first (or top) function 207 in FIG. 2 has two inputs, 201 and 206, of which 201 provides an external signal. The second or bottom function 208 has inputs 202 and 204. Input 202 provides an inverted value of the signal provided by 201 and inverted by 209. The nature of the inverter 209 depends on the requirements for stability and correctness of the overall device. The device 207 has an output 203. The device 208 has an output 205. The output 203 of device 207 is directly connected to input 204 of device 208. Output 205 of device 208 is directly connected with input 206 of device 207.

The configuration of FIG. 2 can be applied to multi-valued logic applications. The selected and applied logic functions will determine if the circuit as described in FIG. 2 will work as an actual information retaining device. Thus, to realize a multi-valued information retaining device the multi-valued logic functions represented by device 207 and 208 must be properly selected.

There are conditions that are essential for information retaining devices according to the configurations of FIG. 1 and FIG. 2. The first condition is that the signal provided by at least one of the outputs of the configuration has to be uniquely related to the input signal. Uniquely related input and output signal means that one can derive an input signal unambiguously from an output signal. The second condition is that each function realized in a device has a finite switching time. A third condition is that the output signal has to be stable after a finite time. Further more the configurations have to be stable and correct for all initial condition. It is recognized that not all initial conditions may occur, and the condition may be too restrictive. A certain settling time is allowed and will be expressed in switching cycles. A switching cycle comprises the time that one function takes to complete an output signal as the result of a changing input signal.

The notation for the solutions is as follows: the possible values or states of the signals on inputs and outputs are shown as vectors between square brackets. Because the initial signal 'a' on input 201 of the top device 207 drives all further activities, it is shown as the basic, ordered input vector with n different values a=[0 1 2 . . . (n−1)] for an n-valued solution. This means that the input can have any one of the states 0, 1, 2, . . . n−2, n−1. All other signals are represented in the same way. Most likely, the states of the other signals may be in a different order and look for example like X=[1 2 3 . . . (n−1) 0]. The relation between the different signals is indicated by the position of the values in the vectors. As an example the relation between signals 'a' and X is that when 'a' has value 0 (the first value in its vector) the value of X is 1 (also the first value in the vector of X). So all other signals relate to the order of position of input signal [0 1 2 3 . . . n−1]. An inverter will also be indicated as a vector but shown between parentheses. The ternary identity inverter is then (0 1 2). The position of a value or state using origin 0 in the notation of an inverter provides the generating state. The actual value in that position shows the result of the inversion. A further example is the inverter (1 2 0). This inverter notation may be considered shorthand for (1 2 0)=[0 1 2]→[1 2 0]. For example when the input signal is the 4-valued signal [0 1 2 3] and signal 'e' is derived from 'a' by inverter (2 1 0 3) then 'e' is depicted as [2 1 0 3].

The Switching Model

Figure 3:
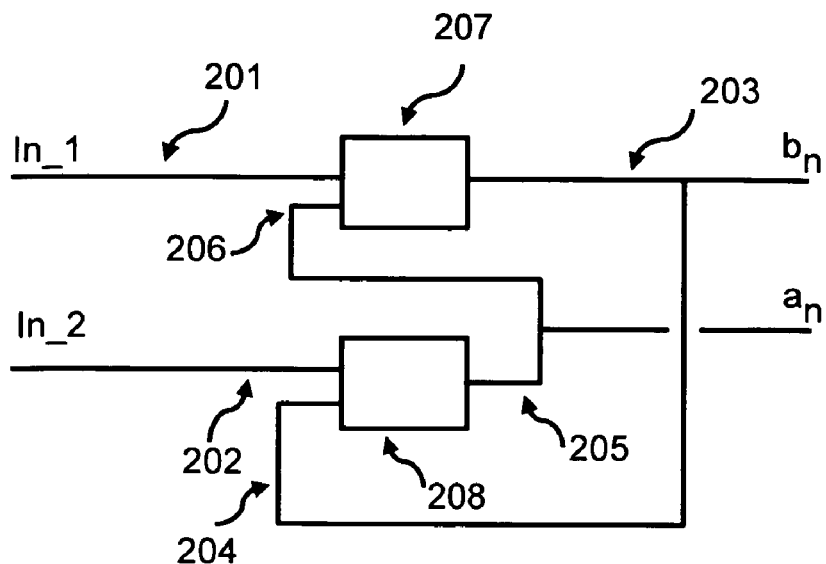
FIG. 3 is a diagram of an n-valued information retaining device with two independent inputs, comprising two n-valued logic functions with feedback.
Figure 4:
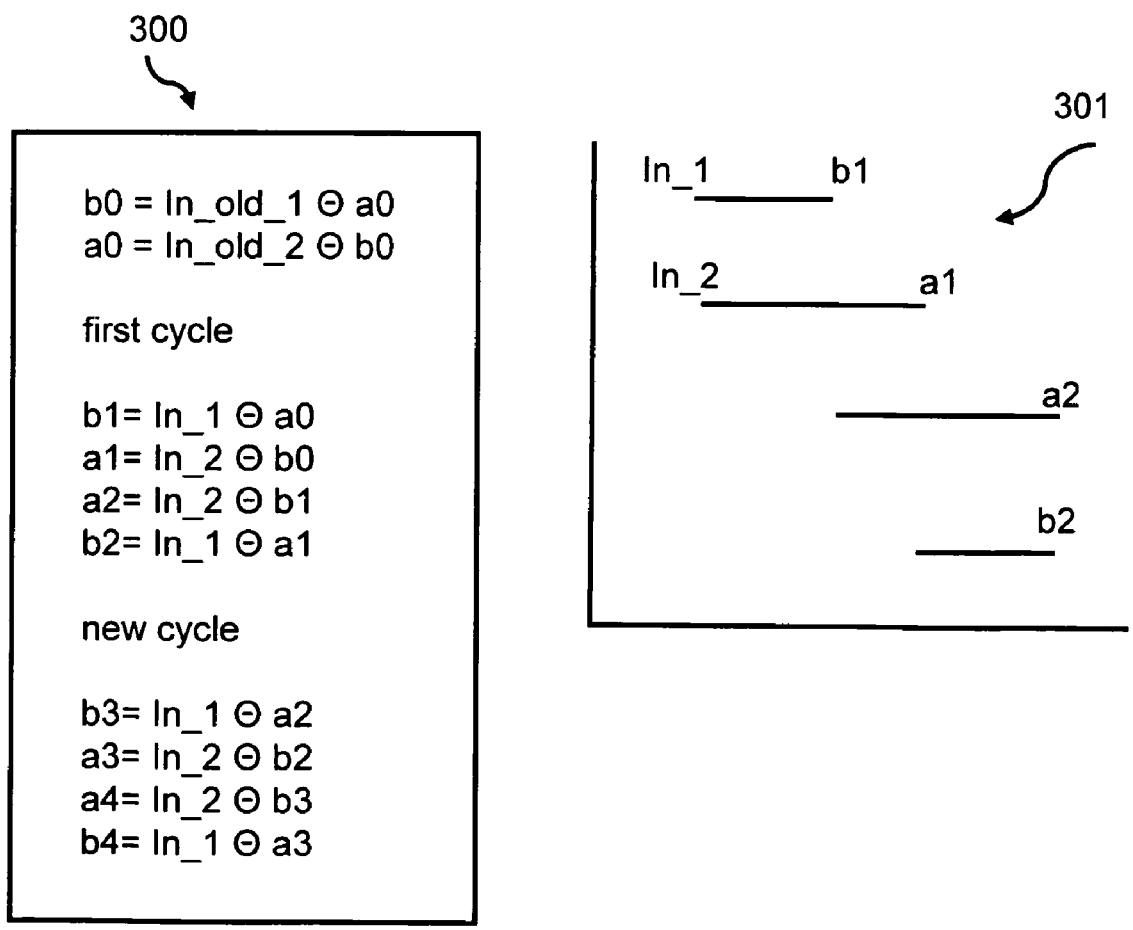
FIG. 4 shows the symbolic expression of the switching model in a table and the time line of the switching model in a graph.

The underlying switching model for any n-valued realization of the configuration of FIG. 2 is shown in FIG. 4. FIG. 3 is a generic configuration of the circuit of FIG. 2 with two independent inputs 201 and 202 and uses the same numerals as in FIG. 2. Its switching behavior is shown symbolically in table 300 and in timelines in graph 301 of FIG. 4. FIG. 4 is a description of the switching behavior of the circuit of FIG. 2 and FIG. 3. It is assumed that the circuit is in a stable situation with signal In_1_old on input 201 and In_2_old on 202. A signal b0 will be generated on output 203 according to b0= (In_1_old θa0). And a signal a0 will be generated on output 205 according to a0=(In_2_old θb0). The symbol θ indicates the logic function that is executed. It should be clear that this model holds for any n-valued logic and does not depend on the value of n in that context. Also devices 207 and 208 are for illustrative purposes assumed to execute the same logic function, which is not essential to the model. Thus, FIG. 4 represents a switching model that can be implemented on a computer to model the circuit of FIG. 2 and of FIG. 3.

The signal provided by 201 changes to In_1 and the signal provided by 202 changes to In_2. There is a finite time required for devices 207 and 208 to complete the generation of a new output value as the consequence of a new input value. Consequently, during a finite period, the devices still see the old initial values a0 and b0 on the inputs 204 and 206. The devices will first generate a new output as a result of the new input values and the initial condition, followed by the result of the new input value and the newly generated output values. Because the switching is causal (a new result can not be generated before a new input signal is available) one output result can not surpass the other one in speed, and after two switching cycles (also called a complete cycle) a complete cycle starts again. One may then conclude that when two consecutive results on an output are identical the device has achieved stability. So when b3−b2≠0 and a3−a2≠0 and b4−b3=0 and a4−a3=0 then the configuration of FIG. 3 achieved stability after the third switching cycle (or 1½ complete cycle). In general the stability condition achieved in switching cycle (n−1) is in formula: $b_n=b_{n-1}$ and $a_n=a_{n-1}$.

Testing Stability.

The stability and correctness of the multi-valued information retaining devices will be achieved when the signal on the output of the device is directly related to the signal on the input, either by having the same value or a reversible inverted value. The device should lock in to the desired value. It is possible for the device to get into a temporary un-desired state. However the applied logic function should force the device out of such undesired state. It should be clear that achieving stability should be a function of the applied logic, not of the physical realization of the function.

Stability can be achieved in two ways. The preferred way is that each specific signal provided by input 201 always creates the same and uniquely related output signal on output 203. An undesired form of stability is when two different signals provided by input 201 create an identical output signal on 203. Instability is when the signal on output 203 will not arrive at a constant value, but keeps on changing.

Some logic functions, especially in higher value logic, can create a significant number of intermediate states before the device stabilizes.

One aspect of the present invention is to test the generated signals on the outputs of the device against previous values of the signals by applying the switching model. When the signals on an output during at least two consecutive switching cycles are identical then the device is assumed to be stable. The signal on one output may reach stability one switching cycle before the signal output achieves stability on the other output.

Figure 5:
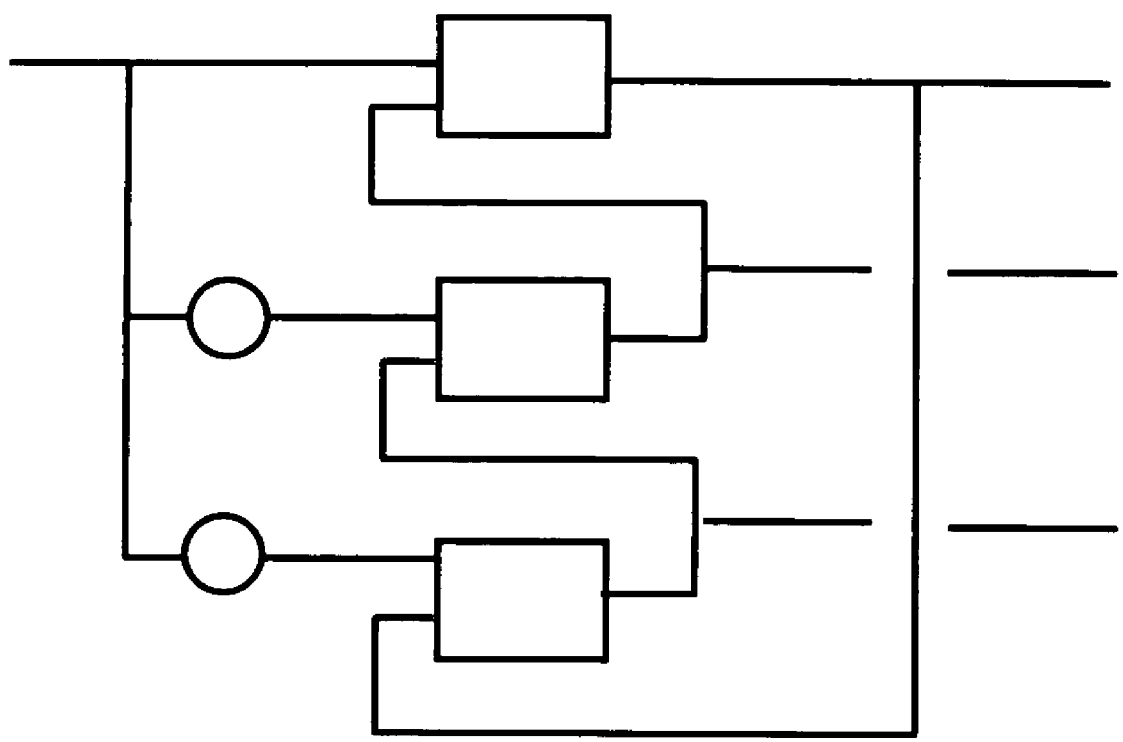
FIG. 5 is a diagram of an n-valued information retaining device with a first independent input and a second and third derived input comprising three n-valued logic functions with feedback.

One may create latching devices from 3 or more instead of 2 logic functions. This influences the number of cycles it takes to create a stable latch. Such a 3-element information retaining device is sometimes known as a "flip-flap-flop" and is for instance described in the article: Brousentsov's Ternary Principle, Bergman's Number System and Ternary Mirror-symmetrical Arithmetic by Alexey Stakhov and published in The Computer Journal, Vol. 45, No. 2, 2002. A three-element multi-valued information retaining device with one independent input is shown in FIG. 5. This three element device is different from the cited article.

Principle of Finite Switching Time Applied in a Switching Model

Figure 6:
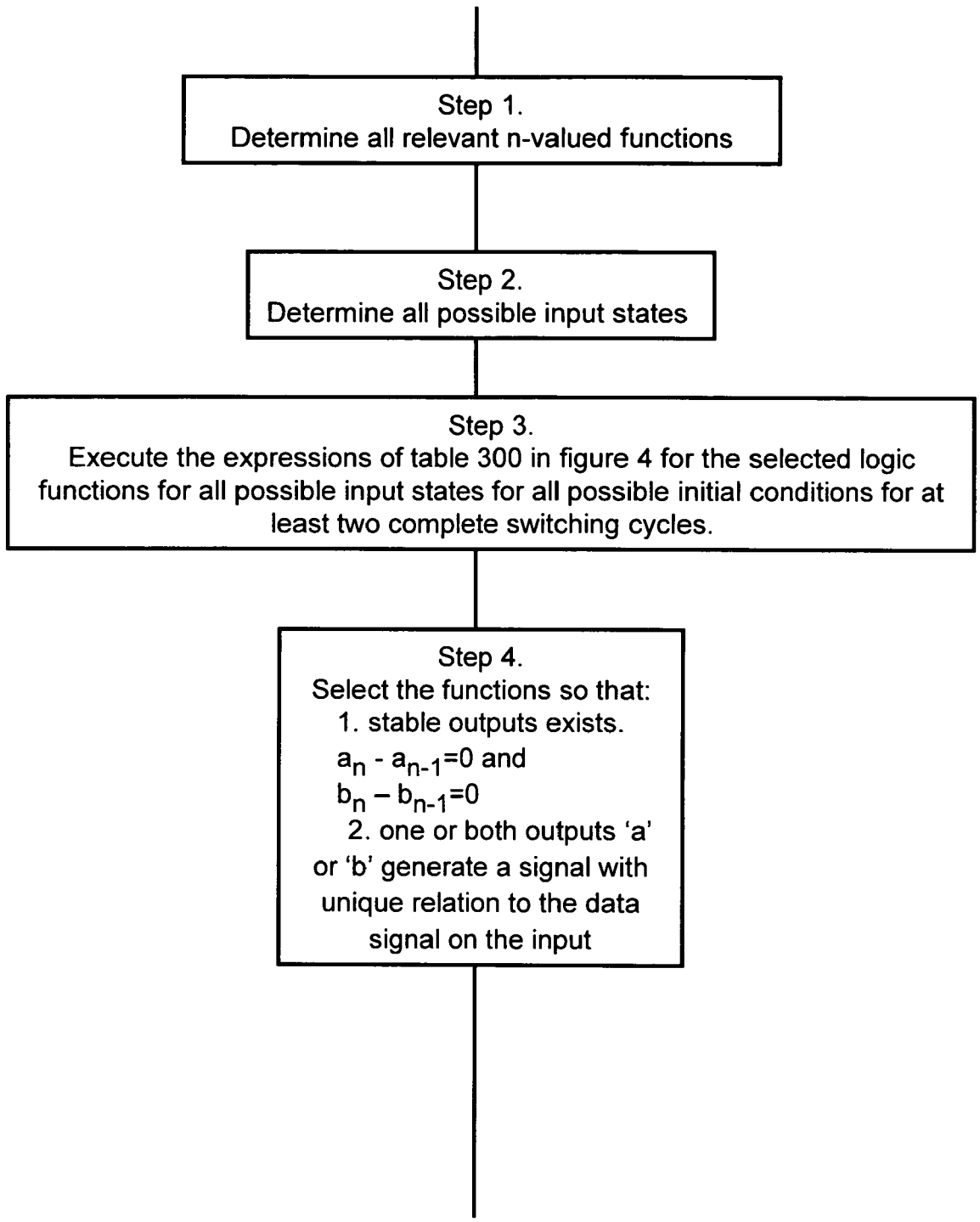
FIG. 6 is the flow diagram explaining the steps to apply the switching model of FIG. 4.

It should be clear that the circuit of FIG. 2 or FIG. 3 is stable if the state of an output does not change. In formula: $b_n=b_{n-1}$ and $a_n=a_{n-1}$. The configuration of FIG. 2 will comply with these conditions when the appropriate logic functions are applied and lead to an output signal 'b' on 203 that does not change and stabilizes after going through one or more cycles. The method can be implemented in a computer program to generate all different initial starting states. FIG. 6 shows a flow diagram for a procedure that will determine the enabling n-valued logic functions for information retaining purposes.

The flow diagram of FIG. 6 has 4 steps: Step 1 comprises determining all relevant logic functions. This may involve for instance exclude if one so wishes all non-commutative logic functions. Step 2 comprises identifying all possible input conditions. Step 3 comprises the execution of the expressions of the switching model of FIG. 4 for all possible input conditions and all possible initial conditions for a plurality of switching cycles. Step 4 comprises the identification of the logic functions that will create stable output signals that are uniquely related to the input data signals when executing Step 3. The functions identified in step 4 can thus implement the devices 207 and 208 of FIG. 2 and realize stable information retaining devices according to the diagram of FIG. 2.

Artificial Signal Delays

In real-life physical realizations the switching speed of the individual devices may vary. One may in actual realization decrease the switching speed of the devices that implement the logic functions.

A way to make the time for a signal to travel longer is to create deliberate delays. Assuming that an n-valued logic inverter takes a finite time to transform an input signal to an output, one can use two or more n-valued inverters to delay a signal. This is shown in a diagram FIG. 7a. A connection from input 110 to output 112 has two (for illustrative purposes 4-valued) reversible inverters. The presence of the inverters should not affect the state of a signal provided on the output of a connection compared to the signal on its input. Consequently this method for delays always has to invert an inverted signal back to its original state.

Figure 7A:
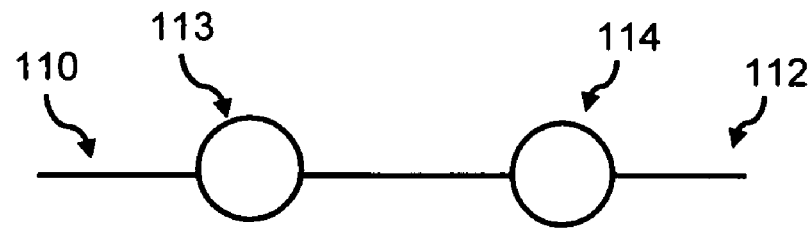
FIG. 7a is a diagram of two serial reversible inverters creating a signal delay.

In the diagram of FIG. 7a the first inverter 113 is the 4-valued self reversing inverter (2 3 0 1). The second inverter 114 then has to be an inverter identical to 113 to create the original signal at the output.

One can also take 113 to be (1 2 3 0). The inverter 114 then has to be (3 0 1 2). The inverter 114 is a shifted version of 113. These types of inverters have been identified and called "universal" inverters in U.S. Non-Provisional Patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS, which is incorporated herein by reference. They are called universal because an n-valued universal inverter can transform any n-valued state to any other n-valued state within at most (n−1) times applying the inverter. Applying an n-valued universal inverter n times on one of an n-valued logic state will create this state.

Figure 7B:
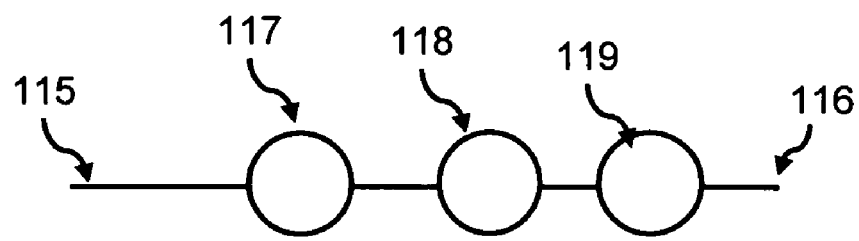
FIG. 7b is a diagram of three serial reversible inverters creating a signal delay.

FIG. 7b shows a diagram of a connection with 3 4-valued reversible inverters 117, 118 and 119. For instance the inverters 117 and 118 can be (1 2 3 0) and inverter 119 (2 3 0 1) to make sure that the signal provided by input 115 is identical to the signal generated on output 116.

An n-valued Memory Device From Inverters and Clocked Gates

Figure 7C:
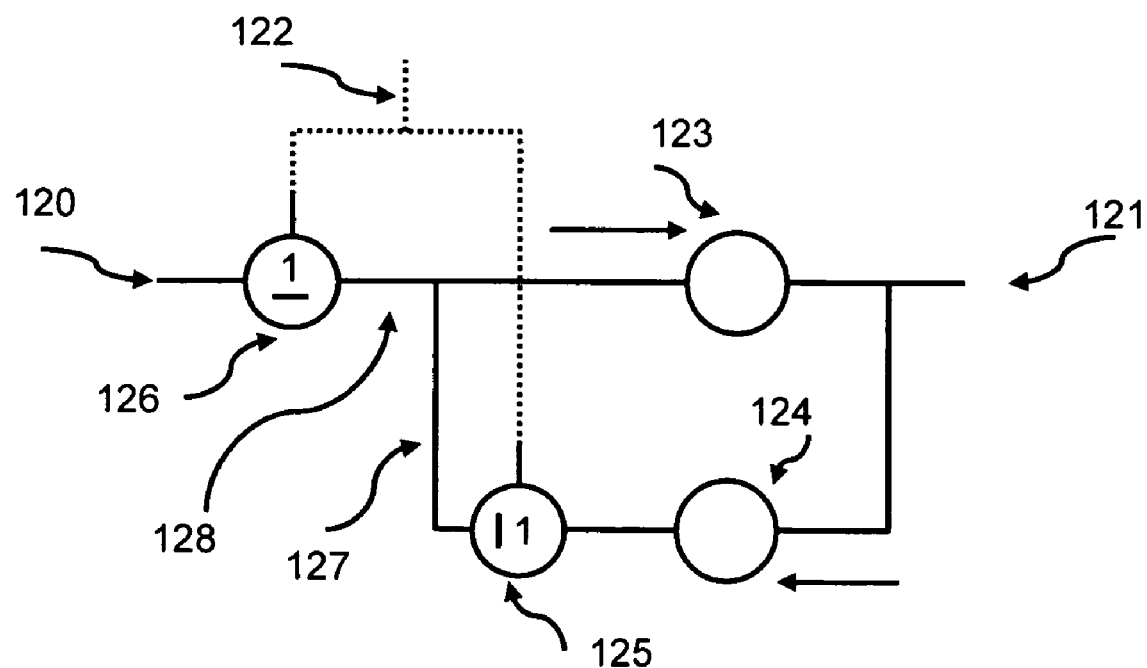
FIG. 7c is a diagram of an n-valued memory device realized from n-valued inverters with feedback and individually controlled gates.

It is another aspect of the present invention to create an n-valued memory device from n-valued reversible inverters and individually controlled gates. This aspect of the invention is shown in FIG. 7c. The device of FIG. 7c has an input 120 which provides an n-valued signal. A signal is generated on output 121. The circuit contains an n-valued reversible inverter 123 which provides its result on output 121. The circuit also has an inverter 124 in a feedback loop. The inverter functions may be selected depending on the required output signal, or on the required delay. One may create an inverter such that it is created as a composite of 2 or more inverters. For illustrative purposes it is assumed that the combination of inverter 123 and inverter 124 will be identity. In that case the output 121 will always generate an inverted version from the signal provided on 120. The circuit also contains two individually controlled gates 125 and 126. Gate 126 is conducting when the control signal provided on control input 122 is 1. Gate 126 is non-conducting when the signal provided on 122 is 1 and conducting when it is NOT 1. The control signals are selected for illustrative purposes only. However whatever gates and/or control signals are selected those skilled in the art will recognize that gates 125 and 126 may not be conducting at the same time. When the gate 126 is conducting and 125 is non-conducting the signal provided on 120 will be inverted and be provided on output 121. When gate 126 is non-conducting and 125 is conducting the signal on 121 will be fed back through inverter 124 to output 127 of the gate 125 and will be the signal inputted to inverter 123. Thus the signal now generated on output 121 will be identical to the previous value of the signal on 121 no matter what the signal is on input 120. Consequently the circuit acts as an n-valued memory device.

Validation of the Switching Model on the Binary Latch

One can apply the method shown in FIG. 4 which is part of the present invention by applying it to all 16 binary functions and check which one of the binary functions applied in the configuration of FIG. 3 will create stable and correct output results. The truth tables of the 4 (non-trivial) binary functions that will enable a latch according to the present invention are shown in the following table.

| B1 | 0 | 1 | B2 | 0 | 1 | B3 | 0 | 1 | B4 | 0 | 1 |
|---|---|---|---|---|---|---|---|---|---|---|---|
| 0 | 1 | 0 | 0 | 0 | 0 | 0 | 1 | 0 | 0 | 1 | 1 |
| 1 | 0 | 0 | 1 | 1 | 0 | 1 | 1 | 1 | 1 | 1 | 0 |

Function B1 is the NOR function and function B4 is the NAND function and are of course known in prior art to enable a binary latch. Binary latches formed by the non-commutative binary functions B2 and B3 are novel and no prior art has been found. Thus the elements 207 and 208 of FIG. 3 can be implemented with the functions B1, or B2, or B3 or B4 of which B1 (the NOR function) and B4 (the NAND function) are known to implement the binary latch.

It is known that binary latches created from NOR and NAND functions have, what is called, illegal or forbidden input signal combinations. For the NAND latch that is when both input signals having 0 at the same time; and for the NOR latch the forbidden situation is when both inputs of the latch are at the 1 level at the same time.

For illustrative purposes the following table shows the result of all binary outputs for all binary inputs and all possible initial conditions for the binary latch according to the configuration of FIG. 3 for which the binary NAND function, shown as truth table B4, will be used.

| In_1 | In_2 | b1 | b2 | b3 | b4 | a1 | a2 | a3 | a4 | b0 | a0 |
|---|---|---|---|---|---|---|---|---|---|---|---|
| 0 | 0 | 1 | 1 | 1 | 1 | 1 | 1 | 1 | 1 | 0 | 0 |
| 0 | 0 | 1 | 1 | 1 | 1 | 1 | 1 | 1 | 1 | 0 | 1 |
| 0 | 0 | 1 | 1 | 1 | 1 | 1 | 1 | 1 | 1 | 1 | 0 |
| 0 | 0 | 1 | 1 | 1 | 1 | 1 | 1 | 1 | 1 | 1 | 1 |
| 0 | 1 | 1 | 1 | 1 | 1 | 1 | 0 | 0 | 0 | 0 | 0 |
| 0 | 1 | 1 | 1 | 1 | 1 | 1 | 0 | 0 | 0 | 0 | 1 |
| 0 | 1 | 1 | 1 | 1 | 1 | 0 | 0 | 0 | 0 | 1 | 0 |
| 0 | 1 | 1 | 1 | 1 | 1 | 0 | 0 | 0 | 0 | 1 | 1 |
| 1 | 0 | 1 | 0 | 0 | 0 | 1 | 1 | 1 | 1 | 0 | 0 |
| 1 | 0 | 0 | 0 | 0 | 0 | 1 | 1 | 1 | 1 | 0 | 1 |
| 1 | 0 | 1 | 0 | 0 | 0 | 1 | 1 | 1 | 1 | 1 | 0 |
| 1 | 0 | 0 | 0 | 0 | 0 | 1 | 1 | 1 | 1 | 1 | 1 |
| 1 | 1 | 1 | 0 | 1 | 0 | 1 | 0 | 1 | 0 | 0 | 0 |
| 1 | 1 | 0 | 0 | 0 | 0 | 1 | 1 | 1 | 0 | 0 | 1 |
| 1 | 1 | 1 | 1 | 1 | 0 | 0 | 0 | 0 | 0 | 1 | 0 |
| 1 | 1 | 0 | 1 | 0 | 1 | 0 | 1 | 0 | 1 | 1 | 1 |

The table explains the behavior of a binary latch formed by NAND gates. The signal 'In_1' relates to the signal on input 201 of FIG. 3; signal 'In_2' relates to input 202; signal 'bn' relates to output 203; signal 'an' relates to output 205. The signal 'b0' is the initial condition of output 203 and 'a0' is the initial condition of output 205 at the start of a new cycle after an input signal was changed.

The table shows that when input signals 'In_1' and 'In_2' both are 1 and its initial condition (b0,a0) was (0,1) then its stable output signal 'b' is 0. When input signal 'In_1' and 'In_2' are 1 and its initial condition (b0,a0) was (1,0) then its stable output signal 'b' is 1. All situations with input signals 'In_=0' and 'In_2=1', for all initial conditions, will generate a signal b=1 on output 203 and a=0 on 205. All situations with input signals 'In_1=1' and 'In_2=0', for all initial conditions, will generate a signal 'b=0' on output 203 and a=1 on 205.

The table also shows that output 203 will not be stable for 'In_1=1' and 'In_2=1' when its initial condition (b0,a0) was (0,0) and thus is marked an invalid or forbidden condition. The model and analysis concurs with the performance of the known NAND latch.

A similar analysis can be applied to the latch based on the NOR gate. Such application of the switching model and its analysis will again concur with the performance of the known NOR latch.

Running the model of FIG. 4 on the configuration of FIG. 3 with the used binary function provided by truth table B2 provides a binary latch that is stable for input signals 'In_1=1' and 'In_2=1' when the initial states (b0,a0) were (0,1) and (1,0). The state (b0,a0)=(0,0) is a forbidden state.

Running the model of FIG. 4 on the configuration of FIG. 3 with the used binary function provided by truth table B3 provides a binary latch that is stable for input signals 'In_=0' and 'In_2=0' when the initial states (b0,a0) are (0,1) and (1,0). The state (b0,a0)=(1,1) is a forbidden state.

At least one additional binary latch can thus be created and realized with identified forbidden states, using non-identical binary functions. In particular a sequential binary circuit according to the configuration of FIG. 3 with binary functions B21 and B22 will create a latch. The truth tables of B21 and B22 are provided in the following table.

| B21 | 0 | 1 | B22 | 0 | 1 |
|---|---|---|---|---|---|
| 0 | 1 | 1 | 0 | 0 | 1 |
| 1 | 0 | 1 | 1 | 0 | 0 |

Thus one can run the switching model of FIG. 4 on a computer for all possible input conditions, for all possible (binary) logic functions and for all initial conditions to determine which logic functions can be implemented in device 207 and 208 of FIG. 3 to achieve a stable latch, which can retain under certain input conditions, the output states resulting from a previous input condition. This is true for binary signals. This is also true for multi-valued signals when applying the correct switching model.

The Ternary Case

The switching model and method and analysis based on the model of FIG. 4 and the configuration of FIG. 2 can be used to design and realize 2-function ternary logic information retaining devices.

The following tables illustrate three logic functions (L1, L2 and L3) that generate the correct output in a stable fashion in the configuration of FIG. 2.

| L1 | 0 | 1 | 2 | L2 | 0 | 1 | 2 | L3 | 0 | 1 | 2 |
|---|---|---|---|---|---|---|---|---|---|---|---|
| 0 | 1 | 1 | 0 | 0 | 0 | 1 | 1 | 1 | 0 | 1 | 2 |
| 1 | 2 | 0 | 0 | 1 | 1 | 0 | 0 | 0 | 1 | 1 | 0 |
| 2 | 2 | 1 | 2 | 2 | 2 | 2 | 2 | 2 | 2 | 0 | 2 |

The configuration of FIG. 2 with functions 207 and 208 with truth table L3 and inverter 209 (1 0 2) is a stable and correct information retaining device. L3 is used as an example of a commutative function. It achieves stability in one switching cycle. With the independent input signal [0 1 2] the signal of 207 on output 203 will be [1 0 2] and the signal on output 205 of device 208 will be [0 1 2].

The result of all possible switching cycles of this configuration is shown in the following table:

| in | b0 | B1 | b2 | b3 | b4 | a0 | a1 | a2 | a3 | a4 |
|---|---|---|---|---|---|---|---|---|---|---|
| 0 | 0 | 1 | 1 | 1 | 1 | 0 | 1 | 0 | 0 | 0 |
| 0 | 0 | 1 | 1 | 1 | 1 | 1 | 1 | 0 | 0 | 0 |
| 0 | 0 | 2 | 1 | 1 | 1 | 2 | 1 | 0 | 0 | 0 |
| 0 | 1 | 1 | 1 | 1 | 1 | 0 | 0 | 0 | 0 | 0 |
| 0 | 1 | 1 | 1 | 1 | 1 | 1 | 0 | 0 | 0 | 0 |
| 0 | 1 | 2 | 1 | 1 | 1 | 2 | 0 | 0 | 0 | 0 |
| 0 | 2 | 1 | 1 | 1 | 1 | 0 | 0 | 0 | 0 | 0 |
| 0 | 2 | 1 | 1 | 1 | 1 | 1 | 0 | 0 | 0 | 0 |
| 0 | 2 | 2 | 1 | 1 | 1 | 2 | 0 | 0 | 0 | 0 |
| 1 | 0 | 1 | 0 | 0 | 0 | 0 | 1 | 1 | 1 | 1 |
| 1 | 0 | 0 | 0 | 0 | 0 | 1 | 1 | 1 | 1 | 1 |
| 1 | 0 | 0 | 0 | 0 | 0 | 2 | 1 | 1 | 1 | 1 |
| 1 | 1 | 1 | 0 | 0 | 0 | 0 | 1 | 1 | 1 | 1 |
| 1 | 1 | 0 | 0 | 0 | 0 | 1 | 1 | 1 | 1 | 1 |
| 1 | 1 | 0 | 0 | 0 | 0 | 2 | 1 | 1 | 1 | 1 |
| 1 | 2 | 1 | 0 | 0 | 0 | 0 | 2 | 1 | 1 | 1 |
| 1 | 2 | 0 | 0 | 0 | 0 | 1 | 2 | 1 | 1 | 1 |
| 1 | 2 | 0 | 0 | 0 | 0 | 2 | 2 | 1 | 1 | 1 |
| 2 | 0 | 2 | 2 | 2 | 2 | 0 | 2 | 2 | 2 | 2 |
| 2 | 0 | 0 | 2 | 2 | 2 | 1 | 2 | 2 | 2 | 2 |
| 2 | 0 | 2 | 2 | 2 | 2 | 2 | 2 | 2 | 2 | 2 |
| 2 | 1 | 2 | 2 | 2 | 2 | 0 | 0 | 2 | 2 | 2 |
| 2 | 1 | 0 | 2 | 2 | 2 | 1 | 0 | 2 | 2 | 2 |
| 2 | 1 | 2 | 2 | 2 | 2 | 2 | 0 | 2 | 2 | 2 |
| 2 | 2 | 2 | 2 | 2 | 2 | 0 | 2 | 2 | 2 | 2 |
| 2 | 2 | 0 | 2 | 2 | 2 | 1 | 2 | 2 | 2 | 2 |
| 2 | 2 | 2 | 2 | 2 | 2 | 2 | 2 | 2 | 2 | 2 |

The table shows the independent input signal "in" provided on input 201 of FIG. 2 in the first column of the above table. The columns under a0 and b0 show the initial value of the outputs 205 and 203, when the input on 201 is changed from a stable situation. The columns under b1, b2, b3 and b4 show the output signal on 203 in consecutive switching cycles; and the columns under a1, a2, a3 and a4 show the output signal on 205 in consecutive cycles. The output values can be determined by filling in the correct values of the input signals in the model provided by the expressions in table 300 of FIG. 4.

One can clearly see that starting with state a2 the following states a3 and a4 remain the same. The same applies for the states b3 and b4 after b2. This demonstrates that the configuration is stable and reaches stability quickly. One can also distinguish that for each value of signal "in" the output is uniquely related to the input. For instance when in=0 then b=1 and a=0 in the stable situation; when in=0 then a=1 and when in=2 then a=2. So the input in=[0 1 2] is translated into a=[0 1 2] on an output. Also the output signal a on output 205 becomes stable in just one switching cycle.

The table shows the switching status for all possible initial conditions. The requirements for stability based on all possible (rather than likely) stable conditions have been very strict. Only the stable situations (b,a) equivalent to (1,0), (0,1) and (2,2) are supposed to occur. The current solution shown in the table will drive the configuration also into a stable end state when the input is switched in the middle of an unstable state.

This solution is distinctly different from the binary latch, wherein one specific input combination reflects an earlier input signal on its output. While the ternary (and as will be shown the n-valued) functions force the output signal to be latched to the input signal, the functions in these latching examples are specifically selected so that the latching effect is not dependent upon earlier states. A gating device with feedback is required to create a memory device.

For illustrative purposes an example of a configuration with incorrect, as well as unstable states will be provided. The configuration of FIG. 2 is again used with the inverter 209 (1 2 0) instead of (1 0 2) and with a ternary logic function with the truth table L3.

The following table shows all states of the configuration determined by applying the impressed signals on 201 with the function of the truth table and calculating each individual state by going through all possible initial states using the model 300 of FIG. 4.

| in | b0 | B1 | b2 | b3 | b4 | a0 | a1 | a2 | a3 | a4 |
|---|---|---|---|---|---|---|---|---|---|---|
| 0 | 0 | 1 | 1 | 1 | 1 | 0 | 1 | 0 | 0 | 0 |
| 0 | 0 | 1 | 1 | 1 | 1 | 1 | 1 | 0 | 0 | 0 |
| 0 | 0 | 2 | 1 | 1 | 1 | 2 | 1 | 0 | 0 | 0 |
| 0 | 1 | 1 | 1 | 1 | 1 | 0 | 0 | 0 | 0 | 0 |
| 0 | 1 | 1 | 1 | 1 | 1 | 1 | 0 | 0 | 0 | 0 |
| 0 | 1 | 2 | 1 | 1 | 1 | 2 | 0 | 0 | 0 | 0 |
| 0 | 2 | 1 | 1 | 1 | 1 | 0 | 0 | 0 | 0 | 0 |
| 0 | 2 | 1 | 1 | 1 | 1 | 1 | 0 | 0 | 0 | 0 |
| 0 | 2 | 2 | 1 | 1 | 1 | 2 | 0 | 0 | 0 | 0 |
| 1 | 0 | 1 | 0 | 1 | 0 | 0 | 2 | 0 | 2 | 0 |
| 1 | 0 | 0 | 0 | 0 | 0 | 1 | 2 | 2 | 2 | 2 |
| 1 | 0 | 0 | 0 | 0 | 0 | 2 | 2 | 2 | 2 | 2 |
| 1 | 1 | 1 | 1 | 1 | 1 | 0 | 0 | 0 | 0 | 0 |
| 1 | 1 | 0 | 1 | 0 | 1 | 1 | 0 | 2 | 0 | 2 |
| 1 | 1 | 0 | 1 | 0 | 1 | 2 | 0 | 2 | 0 | 2 |
| 1 | 2 | 1 | 0 | 1 | 0 | 0 | 2 | 0 | 2 | 0 |
| 1 | 2 | 0 | 0 | 0 | 0 | 1 | 2 | 2 | 2 | 2 |
| 1 | 2 | 0 | 0 | 0 | 0 | 2 | 2 | 2 | 2 | 2 |
| 2 | 0 | 2 | 0 | 2 | 0 | 0 | 1 | 2 | 1 | 2 |
| 2 | 0 | 0 | 0 | 0 | 0 | 1 | 1 | 1 | 1 | 1 |
| 2 | 0 | 2 | 0 | 2 | 0 | 2 | 1 | 2 | 1 | 2 |
| 2 | 1 | 2 | 0 | 2 | 0 | 0 | 1 | 2 | 1 | 2 |
| 2 | 1 | 0 | 0 | 0 | 0 | 1 | 1 | 1 | 1 | 1 |
| 2 | 1 | 2 | 0 | 2 | 0 | 2 | 1 | 2 | 1 | 2 |
| 2 | 2 | 2 | 2 | 2 | 2 | 0 | 2 | 2 | 2 | 2 |
| 2 | 2 | 0 | 2 | 0 | 2 | 1 | 2 | 1 | 2 | 1 |
| 2 | 2 | 2 | 2 | 2 | 2 | 2 | 2 | 2 | 2 | 2 |

The table shows instability for the situation where input signal in=1 and b0=0 and a0=0. In that case the values of b2, b3 and b4 keep switching from 0 to 1 and back to 0. Also the output results when stable are also not consistent or correct. For instance when in=1, b0=0 and a0=1 the stable output b4 is 0. However in another situation wherein in=1 and b0=1 and a0=0 then the stable b output b4 is 1.

The table shows two complete cycles for each initial state. Complete cycle 1 determines b1, b2 and a1 and a2. Complete cycle 2 determines b3, b4 and a3 and a4. It turns out that with inverter 209 (2 1 0) there are no correct configurations of ternary information retaining devices as provided in FIG. 2 with any ternary logic function having the diagonal [1 0 2]. By changing the inverter 209 to (1 0 2) there are several stable and correct configurations. One of these was already shown to be the one with function L3.

There are many functions (commutative and non-commutative) with diagonal [2 0 1] and inverter 209 being (2 0 1) that will work, of which a significant number are non-commutative. Non-commutative functions are sometimes unwieldy because of the need to keep absolute care of the correct order of inputs. This is, of course, not required with commutative functions (of which in the ternary case there are 729).

Figure 8:
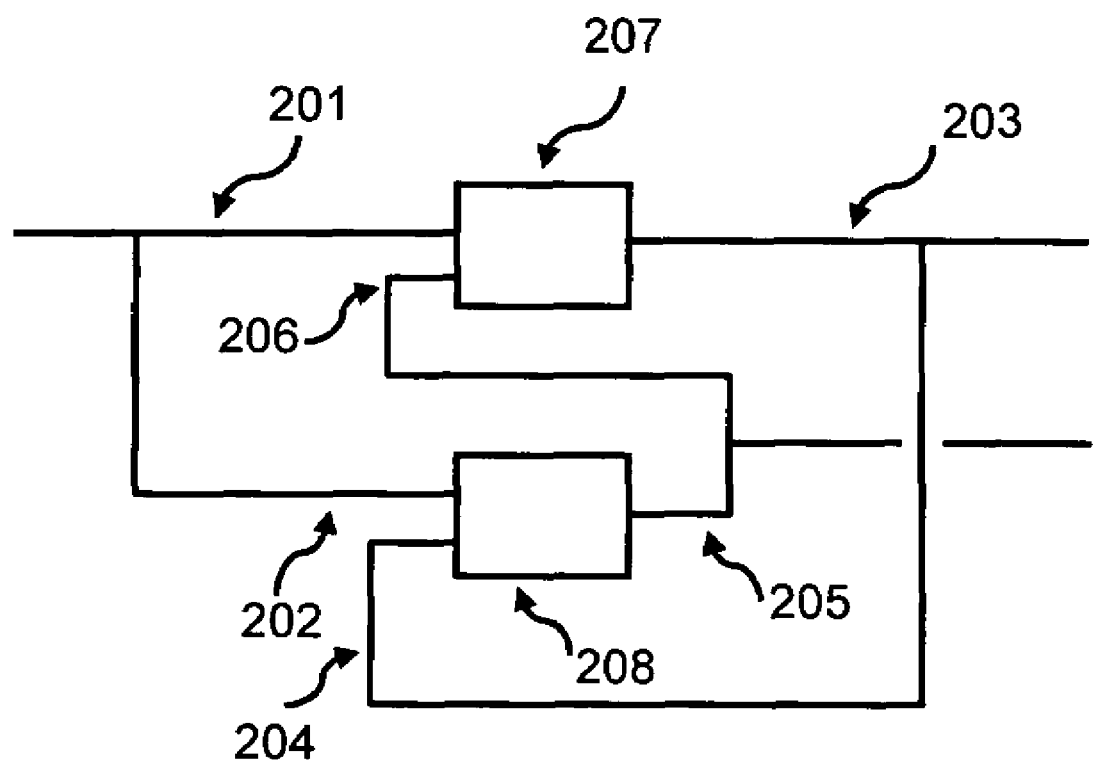
FIG. 8 is another diagram of an n-valued information retaining device with a first independent input, comprising two n-valued logic functions with feedback.

FIG. 8 shows a configuration of the ternary information retaining device of FIG. 2 wherein the inverter 209 is absent. In that case the signals provided by inputs 201 and 202 are identical. The configuration wherein the devices 207 and 208 execute the ternary logic function L4 will act as a stable and correct ternary information retaining device. The truth table of function L4 is provided in the following table:

| L4 | 0 | 1 | 2 |
|---|---|---|---|
| 0 | 1 | 1 | 0 |
| 1 | 1 | 2 | 2 |
| 2 | 0 | 2 | 0 |

This configuration with input signal [0 1 2] generates [1 2 0] on both outputs 203 and 205 of FIG. 8. The outputs are stable after one switching cycle.

One consideration for selecting a specific configuration is the requirement for the order of the generated output signal. For instance it may be a requirement that the ternary signal available on either output 203 or 205 as a consequence of independent input [0 1 2] must also be [0 1 2]. The above example with ternary logic function L4 generates an output signal [1 2 0]. The signal [1 2 0] can be transformed to [0 1 2] by applying ternary inverter (2 0 1).

Another possibility is to select a configuration that will generate output signals [0 1 2] as a consequence of input signal [0 1 2]. The configuration as shown in FIG. 2 with ternary inverter 209 (2 0 1) and with devices 207 and 208 either executing ternary functions I1 or I2 will both generate the desired result. The truth tables of the logic functions are provided in the following truth tables:

| I1 | 0 | 1 | 2 | I2 | 0 | 1 | 2 |
|---|---|---|---|---|---|---|---|
| 0 | 2 | 2 | 1 | 0 | 0 | 0 | 2 |
| 1 | 2 | 0 | 0 | 1 | 0 | 1 | 1 |
| 2 | 1 | 0 | 1 | 2 | 2 | 1 | 2 |

This configuration in FIG. 2 with 207 and 208 executing function I1 will generate [2 0 1] on output 203 and [0 1 2] on output 205. The configuration of FIG. 2 applying function I2 will generate [0 1 2] on both outputs. Stability will be achieved in one switching cycle.

While it is easiest to have two ternary devices in the configuration that execute the same logic function it is not necessary to be limited to identical functions. For instance it is possible to create an information retaining device according to the diagram of FIG. 8 wherein the top device 207 executes a ternary function L5a and the bottom device 208 executes a function L5b. Using again the model of FIG. 4 one can determine the truth tables of the functions that will comply with creating a stable and correct ternary information retaining device.

The following tables show the truth tables of commutative ternary functions L5a and L5b related to the configuration of FIG. 8 that will create a stable and correct ternary information retaining configuration.

| L5a | 0 | 1 | 2 | L5b | 0 | 1 | 2 |
|---|---|---|---|---|---|---|---|
| 0 | 0 | 1 | 2 | 0 | 0 | 0 | 0 |
| 1 | 1 | 1 | 2 | 1 | 0 | 1 | 1 |
| 2 | 2 | 2 | 2 | 2 | 0 | 1 | 2 |

The 4-valued Case

A 4-valued information retaining device applies the same configuration as in FIG. 2 or FIG. 8 and the model of FIG. 4 and the flow diagram of FIG. 6. The difference is that all logic functions will be 4-valued and the inverter 209 will also be 4-valued. Because there are more states to go through in 4-valued logic it is possible that switching stability will be achieved in more than 1 cycle. For that purpose it may be necessary to execute the model of FIG. 4 for more than 2 complete cycles. The general independent 4-valued signal on input 201 is described as [0 1 2 3]. The 4-valued inverter 209 is described as for instance (2 3 0 1). This is shorthand for the inversion (2 3 0 1)=[0 1 2 3]→[2 3 0 1].

The next table shows 4 of the truth tables of the 4-valued commutative logic functions in the basic configuration of FIG. 2 with inverter 209 is (2 3 0 1) that will create stable and correct 4-valued latches.

| F1 | 0 | 1 | 2 | 3 | F2 | 0 | 1 | 2 | 3 | F3 | 0 | 1 | 2 | 3 | F4 | 0 | 1 | 2 | 3 |
|---|---|---|---|---|---|---|---|---|---|---|---|---|---|---|---|---|---|---|---|
| 0 | 2 | 2 | 0 | 2 | 0 | 2 | 3 | 0 | 1 | 0 | 2 | 3 | 0 | 2 | 0 | 2 | 3 | 3 | 2 |
| 1 | 2 | 3 | 3 | 2 | 1 | 3 | 3 | 0 | 3 | 1 | 3 | 3 | 1 | 3 | 3 | 3 | 3 |
| 2 | 0 | 3 | 0 | 1 | 2 | 0 | 0 | 0 | 2 | 0 | 3 | 0 | 0 | 2 | 3 | 3 | 0 | 0 |
| 3 | 2 | 2 | 1 | 1 | 3 | 1 | 3 | 0 | 1 | 3 | 2 | 3 | 0 | 1 | 3 | 2 | 3 | 0 | 1 |

The configuration of FIG. 2 with devices 207 and 208 executing 4-valued logic function F1 and applying 4-valued inverter 209 (2 3 0 1) will create stability within one cycle. As a result of input [0 1 2 3] on 201 it will create a signal [2 3 0 1] on output 203 and a signal [0 1 2 3] on output 205. The same applies for functions F2, F3 and F4.

The complete and exhaustive way to generate all 4-valued commutative functions that will create 4-valued information devices according to the configuration of FIG. 2 is:

generate all commutative 4-valued logic functions.

test each individual configuration with the generated 4-valued logic functions applied in a configuration as showed in FIG. 2 on stability and correctness applying the method as shown in table 300 of FIG. 4 against all possible input signals on input 201 and initial states of inputs 206 and 204 for each of the 24 reversible 4-valued inverters at 209.

test on total number of cycles to achieve stability if desired.

The 5-valued Case

The approach as described for the ternary and 4-valued case, including the model of FIG. 4 and the flow diagram of FIG. 6, applies also to stable 5-valued commutative functions for 5-value information retaining configurations. For illustrative purposes the truth tables of at least 3 commutative functions L51, L52 and L53 that will create stable 5-value information retaining configurations as described in FIG. 2 are shown in the following table. The truth tables L51 and L52 require the application of 5-value inverter 209 (1 2 3 4 0). The configuration with truth table L53 requires inverter 209 (3 4 0 1 2).

| L51 | 0 | 1 | 2 | 3 | 4 | L52 | 0 | 1 | 2 | 3 | 4 | L53 | 0 | 1 | 2 | 3 | 4 |
|---|---|---|---|---|---|---|---|---|---|---|---|---|---|---|---|---|---|
| 0 | 2 | 4 | 4 | 2 | 3 | 0 | 4 | 0 | 1 | 4 | 4 | 0 | 0 | 1 | 2 | 0 | 0 |
| 1 | 4 | 3 | 0 | 0 | 3 | 1 | 0 | 0 | 1 | 2 | 0 | 1 | 1 | 1 | 2 | 3 | 1 |
| 2 | 4 | 0 | 4 | 1 | 1 | 2 | 1 | 1 | 1 | 2 | 3 | 2 | 2 | 2 | 2 | 3 | 4 |
| 3 | 2 | 0 | 1 | 0 | 2 | 3 | 4 | 2 | 2 | 2 | 3 | 3 | 0 | 3 | 3 | 3 | 4 |
| 4 | 3 | 3 | 1 | 2 | 1 | 4 | 4 | 0 | 3 | 3 | 3 | 4 | 0 | 1 | 4 | 4 | 4 |

The generated signal on output 203 is different in each of the two applied functions. In the first case with function L51, the top device 207 generates [2 3 4 0 1] on output 203. It generates a signal [0 1 2 3 4] on the bottom output 205. This configuration is stable within one complete cycle for all possible initial states.

In the second case with L52, it generates [4 0 1 2 3]. However it generates also [0 1 2 3 4] on the bottom output 205. The configuration with L52 and inverter 209 (1 2 3 4 0) is stable within 1 complete cycle for all possible initial states.

In the third illustrative example with L53, both outputs will generate [0 1 2 3 4]. This third illustrative configuration is also stable within one complete cycle for all possible initial states.

The complete and exhaustive way to generate all 5-value commutative functions that will create 5-value memory devices is:

generate all commutative 5-value logic functions.

test each individual configuration according to the method provided in table 300 of FIG. 4 to the configuration provided in FIG. 2 on stability and correctness for all possible input signals to the input 201 and all possible initial states of inputs 206 and 204 for each of 120 5-value inverters at 209.

test on total number of cycles to achieve stability if desired.

A significant number of stable and correct 5-value configurations can be generated. Though not shown one can also use the method to create 2 element 5-valued latches by using 2 not identical 5-valued logic functions. One may also successfully apply non-commutative 5-valued functions.

The n-Valued Case

The approach as described before using the switching model of FIG. 4 and the configuration of FIG. 2 or FIG. 8 can be applied to generate any stable n-valued information retaining configuration as shown in FIG. 2 and FIG. 8. The complete and exhaustive way to generate all n-valued commutative functions that will create n-valued memory devices is:

generate all commutative n-valued logic functions.

test each individual configuration on stability and correctness applying the method as shown in the ternary case against all possible input signals on input 201 and all initial states of input 206 and 204 by applying all n! n-valued inverters 209.

test on total number of cycles to achieve stability if desired.

Single Element (n-valued) Information Retaining Device

Another aspect of the present invention is to create n-valued, single element devices with feedback that will act as a ternary or higher value information retaining device. This means that the output of such a device will assume a state uniquely related to the state of the input, enforced by feeding back the output of the device to one of the inputs.

Figure 9:
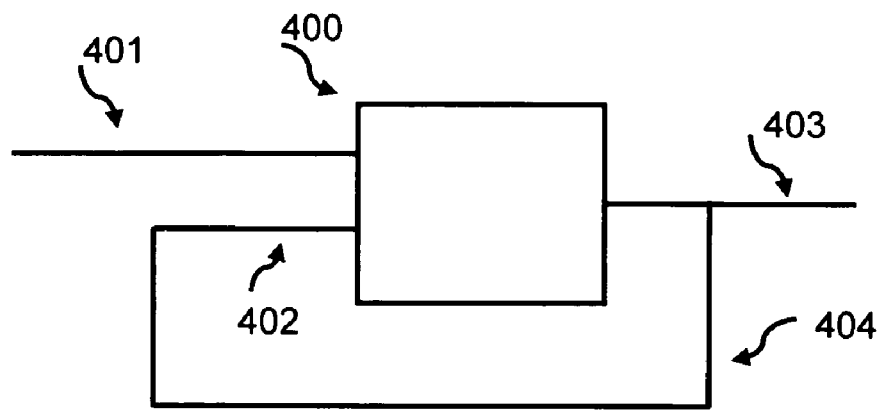
FIG. 9 is a diagram of a single n-valued function information retaining device with feedback.

The basic configuration of such a circuit is shown in diagram in FIG. 9.

A simple logic way to create a single element feedback device is by making all columns (or rows) of the truth table describing the logic function equal to the identity inverter. The ternary case truth table Id is provided in the following table.

| Id | 0 | 1 | 2 |
|---|---|---|---|
| 0 | 0 | 0 | 0 |
| 1 | 1 | 1 | 1 |
| 2 | 2 | 2 | 2 |

Figure 10:
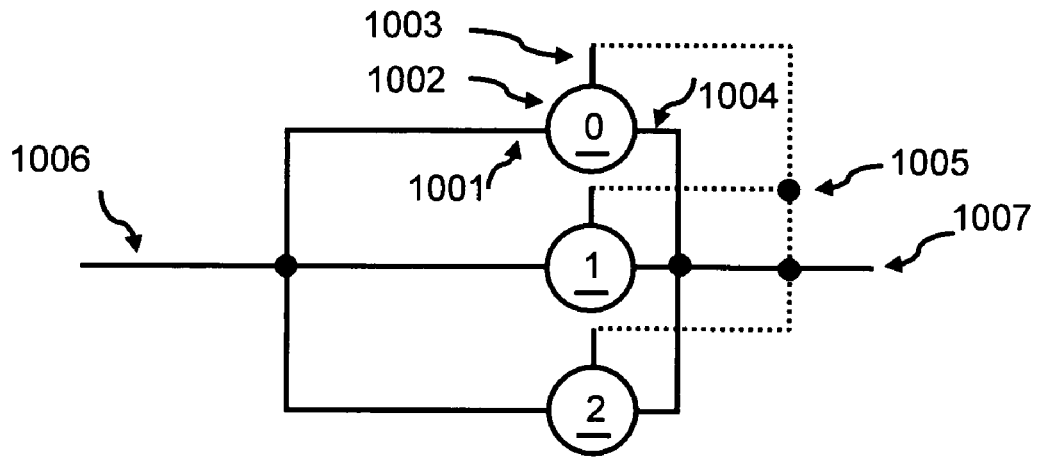
FIG. 10 is a realization of a single function information retaining device with feedback applying individually controlled gates.

The advantage of this function Id is that it can be realized according to the invention related to realization of multi-valued logic circuitry strictly with gates. The method is described in U.S. Non-Provisional Patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS and U.S. Non-Provisional Patent application Ser. No. 11/000,218, filed Nov. 30, 2004, entitled SINGLE AND COMPOSITE BINARY AND MULTI-VALUED LOGIC FUNCTIONS FROM GATES AND INVERTERS which are hereby incorporated by reference in their entirety. A diagram of its realization is shown in FIG. 10. As explained in the cited patent applications the realization is based on application of individually controlled gates and inverters. The individually controlled gates in FIG. 10 are depicted as a circle with a vertical line on top, a horizontal line and a number inside the circle. As an example the gate 1002 in FIG. 10 will be further explained. Gate 1002 has a signal input 1001 and a signal output 1004. Gate 1002 also has a control input 1003. The horizontal line inside the circle combined with the number on top of this horizontal line, indicates that for the signal (in this case 0) provided by control input 1003 of the gate 1002 the connection formed by the gate between input 1001 and output 1004 is conducting. For all other signals provided by control input 1003 the gate is non-conducting. It is assumed in this example that the state "absence of signal" is equivalent with the logic state 0. The solid black circles such as 1005 indicate a hard conducting connection. All gates in the circuit of FIG. 10 have the signal on output 1007 as control signal. This represents the feedback situation. The connections to the control inputs have been drawn as dotted lines for reason of differentiation from other connections only.

Because the state 0 is represented by "absence of signal" the gate 1002 works also as a "safety valve". If for some reason there is "absence of signal" at output 1007 then gate 1002 will always be open and restart the process. It should be clear that if all states are represented by signals not equal to "absence of signal", then "absence of signal" represents no state and if output 1007 ever gets into such a state then the circuit is blocked.

Figure 11:
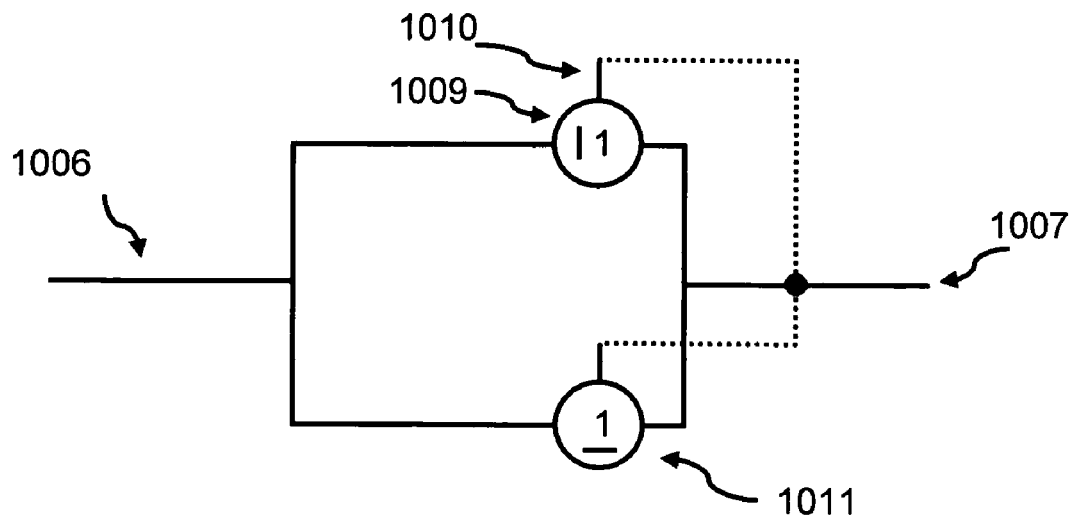
FIG. 11 is another realization of a single function information retaining device with feedback applying individually controlled gates.

To prevent a blocking situation the circuit of FIG. 10 can be replaced by the circuit described by the diagram of FIG. 11. Gate 1009 is a gate which will conduct when its control input 1010 provides a signal not equal to 1. The vertical line inside circle 1009 means that the gate is non-conducting. The number inside 1009 indicates for which signal the gate is non-conducting. This gate replaces the two conducting gates which are conducting for control input signal 0 and 2. Consequently the state "absence of signal" not being equal to state 1, will cause the gate 1009 to be conducting. The other gate 1011 then has to be conducting for the control signal state 1. Consequently the circuit of FIG. 11 represents the generic realization for all n-valued (n being an integer of 2 or greater) functions with identity inverters as columns realizing the diagram of FIG. 9.

Different Logic Realizations of a Single Element Feedback Device

Figure 12:
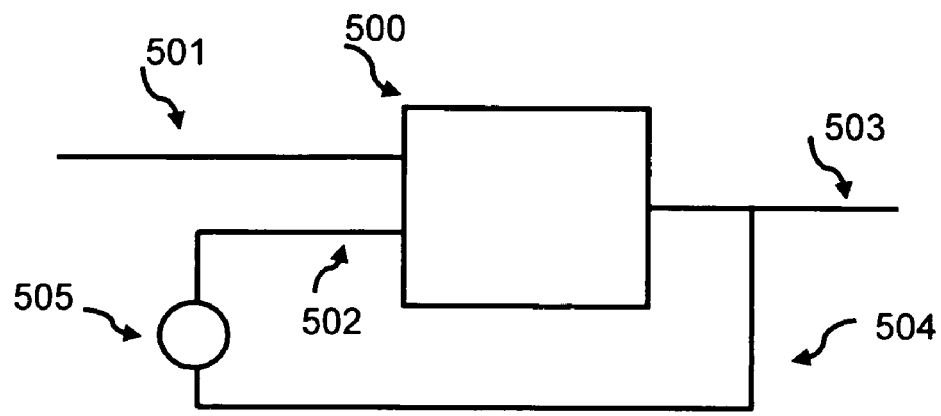
FIG. 12 is another diagram of a single n-valued function information retaining device with feedback.

The device as shown in FIG. 9 has a single 2 input/single output n-valued function 400 with inputs 401 and 402 and an output 403. The output is fed back by 404 into input 402. FIG. 12 shows a variant of this configuration by applying an inverter 505 in the feedback path 504. This will change the n-valued logic functions that will enable such a device, but does not materially change the principle of this method and the realized apparatus.

Assume the following in a stable situation for device as shown in FIG. 9. The input signal on input 401 is a0, which can (as before) be described as a vector of possible states. The output signal on 403 is b0. The feedback through 404 is also b0 when the configuration is stable. The device 400 executes an n-valued two input/single output logic function 'Θ'. An assumption is that a physical device has a finite switching time which is longer than the transmission time of a signal of a connection. This assumption can be enforced by artificially increasing the time it takes for a signal to reach input 401 from output 402 by including inverters in the path. As explained as another aspect of the present invention the inverters for delay purposes can be selected in such a way that their net result is no change in logic state of the signal. As a consequence any new state on input 401 will still be executed against the previous output state through the feedback signal provided on input 402 in device 400. After a finite time a newly calculated state is being outputted on 403 and fed back to 402. Once the output signal does not change anymore (the delayed output is identical with the feedback signal) the device has achieved stability. Correctness is achieved when the stable output signal is uniquely related to the input signal. For proper memory operations a device should achieve stable and correct states.

This invention relates to identifying the correct n-valued logic functions that will:

generate an output that can be uniquely related to a single value of possible inputs;
achieve stability;
do not depend on the initial states of the device for correct operations;
achieve stability in a reasonable number of cycles The majority of n-valued functions do not comply with those requirements in that they: (1) never achieve stability for all states, (2) have no unique relationship between inputs and outputs or, in other words, different inputs may generate the same output, and (3) their outputs depend on inputs as well as previous states.

A description of the stabilizing process for the device in FIG. 9 is shown in the following table as an illustrative example.

| input | feedback | output | stability |
|---|---|---|---|
| a0 | b0 | b0 | stable |
| a1 | b0 | c1 = a1 Θ b0 | unstable |
| a1 | c1 | c2 = a1 Θ c1 | unstable |
| a1 | c2 | c3 = a1 Θ c2 | stable |
| a1 | c3 | c3 = a1 Θ c3 | stable |

The process starts out with input signal a0 and stable output signal b0. The input signal is changed to a1. Because of physical delay the output and feedback signals are still b0. Consequently the device 'sees' inputs a1 and b0 and will generate c1=a1Θb0. The cycle will repeat itself until the feedback signal and the delayed output signal are identical. In the table of the example this is assumed to happen when c2 is generated and c3 is identical to c2. Stability is per definition achieved 1 cycle before it can be detected. A computer program applying all n-valued functions and all possible inputs combined with all possible initial states and calculating a reasonable number of cycles (for example, 2) will identify all possible n-valued functions that will create stable n-valued single element information retaining devices with feedback.

Ternary Single Element Information Retaining Device

There are several ternary logic functions that will perform the required functionality to realize the single function information retaining device. It is easiest to limit the selection to commutative functions as this will prevent confusion on which input to use. However, it should be clear to those skilled in the art that certain non-commutative functions will work as well. The method to determine the appropriate commutative functions is:

a. create all ternary commutative logic functions.
b. determine all possible initial conditions of the device.
c. select those ternary functions that will create stable end-states with the correct output.
d. if desired, select only those functions that stabilize the device in a limited number of cycles.

There are two commutative ternary functions that will enable this type of information retaining device. The two truth tables are shown in the following table.

| Ls1 | 0 | 1 | 2 | Ls2 | 0 | 1 | 2 |
|---|---|---|---|---|---|---|---|
| 0 | 1 | 1 | 0 | 0 | 2 | 0 | 2 |
| 1 | 1 | 2 | 2 | 1 | 0 | 0 | 1 |
| 2 | 0 | 2 | 0 | 2 | 2 | 1 | 1 |

The output of the single element device as shown in FIG. 9 with function 400 "Ls1" is c=[1 2 0] as result of input [0 1 2]. This output will be achieved after one switching cycle for all initial conditions. The output for a device with function 400 "Ls2" is [2 0 1]. This output will be achieved within two switching cycles for all initial conditions. In both cases inverters can be used to recover the original input state.

There are dozens of non-commutative ternary functions that will create stable ternary information retaining devices. The non-commutative function "Ls3" with the following truth table will generate the signal [0 1 2] on output 403.

| Ls3 | 0 | 1 | 2 |
|---|---|---|---|
| 0 | 0 | 1 | 2 |
| 1 | 2 | 1 | 0 |
| 2 | 0 | 0 | 2 |

The following non-commutative ternary function Ls4 applied in the configuration of FIG. 9 will generate the signal [0 1 2] on output 403 as a result of signal [0 1 2] on input 401. The configuration is stable for all initial conditions after two switching cycles.

| Ls4 | 0 | 1 | 2 |
|---|---|---|---|
| 0 | 0 | 0 | 0 |
| 1 | 1 | 1 | 0 |
| 2 | 2 | 2 | 2 |

The 4-valued Single Element Information Retaining Device

The same reasoning as for the ternary case applies to a 4-valued single element information retaining device comprising one function with feedback as shown in FIG. 9 and FIG. 12. There are dozens of different stable single element configurations with commutative 4-valued functions.

The truth tables of two of these functions (L4s1 and L4s2) are shown in the following table. They apply to a configuration according to FIG. 9. Both configurations will be stable for all input conditions within 2 complete switching cycles. The configuration with L4s1 will generate output signal [1 2 3 0] and the configuration with L4s2 will generate output signal [3 0 1 2].

| L4s1 | 0 | 1 | 2 | 3 | L4s2 | 0 | 1 | 2 | 3 |
|---|---|---|---|---|---|---|---|---|---|
| 0 | 1 | 1 | 3 | 0 | 0 | 3 | 0 | 1 | 3 |
| 1 | 1 | 2 | 2 | 2 | 1 | 0 | 0 | 1 | 0 |
| 2 | 3 | 2 | 3 | 3 | 2 | 1 | 1 | 1 | 2 |
| 3 | 0 | 2 | 3 | 0 | 3 | 3 | 0 | 2 | 2 |

In these cases, the device also works as an inverting element. The correct input signal can be recovered from the output by applying a 4-valued inverter.

Non-commutative 4-valued functions can also be used. The 4-valued logic function L4s3 applied in the configuration of FIG. 9 will generate an output signal [0 1 2 3]. The configuration is stable for all initial conditions after 1 switching cycle. The following table provides the truth table of L4s3.

| L4s3 | 0 | 1 | 2 | 3 |
|---|---|---|---|---|
| 0 | 0 | 0 | 0 | 0 |
| 1 | 1 | 1 | 0 | 0 |
| 2 | 2 | 2 | 2 | 0 |
| 3 | 3 | 3 | 3 | 3 |

The 5-value Single Element Information Retaining Device

The same reasoning applies to a 5-value single element information retaining device comprising one function with feedback. There are at least 120 different stable single element configurations with commutative 5-value functions.

The truth table of L5s1, a commutative 5-value logic function that will create a stable and correct configuration as in FIG. 9 is shown in the following table.

| L5s1 | 0 | 1 | 2 | 3 | 4 |
|---|---|---|---|---|---|
| 0 | 4 | 0 | 4 | 2 | 4 |
| 1 | 0 | 0 | 1 | 0 | 3 |
| 2 | 4 | 1 | 1 | 2 | 1 |
| 3 | 2 | 0 | 2 | 2 | 3 |
| 4 | 4 | 3 | 1 | 3 | 3 |

In this case the device also works as an inverting element. It generates the output signal [4 0 1 2 3]. The correct input signal can be recovered from the output by applying a 5-value inverter. This particular configuration stabilizes in 1 switching cycle.

There are also many stable and correct non-commutative configurations. The function L5s2 will create a configuration according to FIG. 9 which is stable after one cycle and generates the output signal [0 1 2 3 4]. The truth table of L5s2 is provided in the following table.

| L5s2 | 0 | 1 | 2 | 3 | 4 |
|---|---|---|---|---|---|
| 0 | 0 | 0 | 0 | 0 | 0 |
| 1 | 1 | 1 | 0 | 0 | 0 |
| 2 | 2 | 2 | 2 | 0 | 0 |
| 3 | 3 | 3 | 3 | 3 | 0 |
| 4 | 4 | 4 | 4 | 4 | 4 |

The n-valued Single Element Information Retaining Device

It should be clear that the above method allows for the creation and design of any n-valued single element information retaining comprising one n-valued logic function with feedback. The results suggest ways to limit the total amount of calculations. For instance only use n-valued commutative functions which have as diagonal: [(n−1) 0 1 2 ... (n−3) (n−2)] and as directly neighboring diagonals above and under: [0 1 2 ... (n−2)]. It is also clear that certain non-commutative n-logic functions applied in the configuration of FIG. 9 will generate output signal [0 1 2 ... (n−1)] and will be stable after 1 switching cycle. The generic truth table for this non-commutative n-valued function is provided in the following table.

| Ln | 0 | 1 | 2 | . | . | . | 0 | n – 1 |
|---|---|---|---|---|---|---|---|---|
| 0 | 0 | 0 | 0 | . | . | . | 0 | 0 |
| 1 | 1 | 0 | 0 | . | . | . | 0 | 0 |
| 2 | 2 | 2 | 0 | . | . | . | 0 | 0 |
| 3 | 3 | 3 | 3 | . | . | . | 0 | 0 |
| . | . | . | . | . | . | . | . | . |
| . | . | . | . | . | . | . | . | . |
| n – 2 | n – 2 | n – 2 | . | . | . | . | n – 2 | 0 |
| n – 1 | n – 1 | n – 1 | . | . | . | . | n – 1 | n – 1 |

The n-valued Digital Memory Device With External Control

A sequential information retaining device does not have to be a memory device. A memory device is in general controlled by an external signal, or by a signal state or combination of states not signifying a data state. A memory device has to be able to provide a previously present Data signal, after that signal is not longer present. A way to use a control signal is to have a current data signal inputted to a memory device when the control signal (or a signal with a control state) is absent. That data input signal may also be provided on the output of the memory device. When the control signal (or a control state) is present, no input signal is accepted by the memory device. The output signal then provided by the memory device represents the data signal which was present when the control signal was absent. One can of course reverse the states of the control signal or control state of a signal for control purposes: in other words Read when present, Store when absent.

The required (old) data signal for memory purposes can be provided by combining a feedback and gating mechanism.

The two function n-valued devices and the single function or element n-valued information retaining devices according to different aspects of the invention can be used as a part in externally controlled n-valued digital memory devices.

Figure 13:
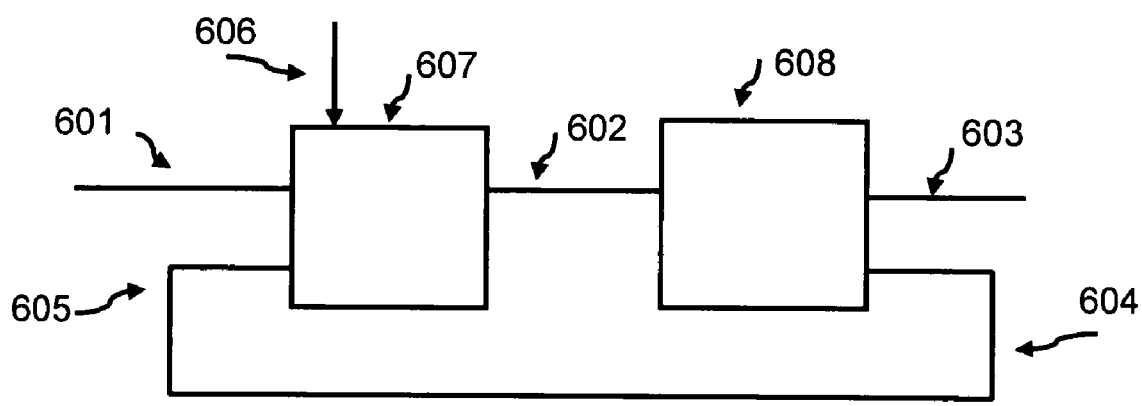
FIG. 13 is a diagram of an n-valued memory device comprising a gating device and an n-valued information retaining device.

The output of an n-valued two function device can be fed back into an n-valued device that has as its inputs external data as well as a controlling signal such as a clock signal. The overall block diagram of such externally controlled n-valued memory is shown in FIG. 13. It comprises an input 601 which will provide the to be retained data signal, a gating device 607 that will pass on the input signal provided by 601 to output 602 when it is activated by a signal on input 606, which can be a clock signal. When the clock signal is absent the gating device 607 will pass the signal on 605 to 602, which is the signal on output 604 of information retaining device 608. The signal on 602 will be inputted to information retaining device 608. The output of the memory device is 603; and output 603 and 604 may provide the same signal, which is the case when the signal provided on 603 is identical to the signal provided by 601. If that is not the case then the signal on 604 needs to be an inverted version of the signal on 603.

Figure 14:
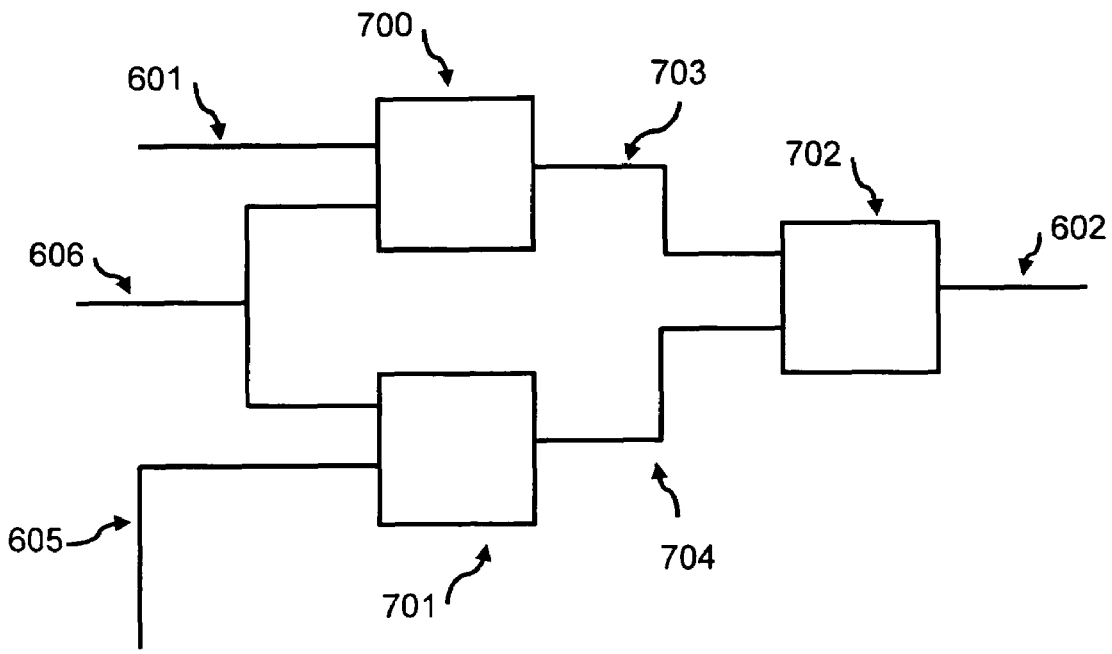
FIG. 14 is a more detailed diagram of an n-valued gating device.

When for instance the clock-signal on 606 is active the gating device lets the external data pass and blocks the feedback signal from the n-valued information retaining device. As a consequence the state of the n-valued information retaining device will adopt the value related to the new data. When the clock signal is not active the gating device will pass the feedback signal into the information retaining device, thus keeping the state of this device unchanged. A block diagram of such a clock-controlled n-valued gating device is shown in FIG. 14. The gating device has the same inputs and indicating numerals as the device FIG. 13: 601 provides the data input, 606 provides the controlling clock signal and 605 provides the feedback from the information retaining device 608. The output of the gating device 602 in FIG. 14 is the same as the output 602 in FIG. 13.

Device 700 has a logic function that will let the data on 601 pass to 703 when the clock signal 606 is activated. For illustrative purposes it is assumed that the function of 700 generates a 0 when the clock signal is inactive. The function of device 701 generates a 0 when the clock is active and passes the signal on 605 on to 704 when the clock in inactive. The device 702 has 703 and 704 as inputs. When both inputs 703 and 704 provide a signal 0 the output 602 will be 0. For all other cases it will pass on the highest value of the two signals on the inputs 703 and 704. For illustrative purposes it is assumed that the device applies ternary logic. Assume that clock active means 606 has state 1 and clock inactive means 606 has state 0. The ternary function d1 for 700, ternary function d2 for 701 and ternary logic function d3 for 702 will enable the gating device. The truth tables of d1, d2 and d3 are shown in the next table.

| d1 | 0 | 1 | 2 | d2 | 0 | 1 | 2 | d3 | 0 | 1 | 2 |
|---|---|---|---|---|---|---|---|---|---|---|---|
| 0 | 0 | 0 | 0 | 0 | 0 | 0 | 0 | 0 | 0 | 1 | 2 |
| 1 | 0 | 1 | 2 | 1 | 1 | 0 | 2 | 1 | 1 | 1 | 2 |
| 2 | 0 | 2 | 0 | 2 | 2 | 0 | 2 | 2 | 2 | 2 | 2 |

It should be clear that in function d1 only the first two columns are important. The third column is selected to make the function commutative. In the non-commutative function d2 only the first two columns are of importance (as the clock will never be 2). In the truth table of d3 only the first column and the first row are of significance as either 703 or 704 will always provide a 0.

Figure 15:
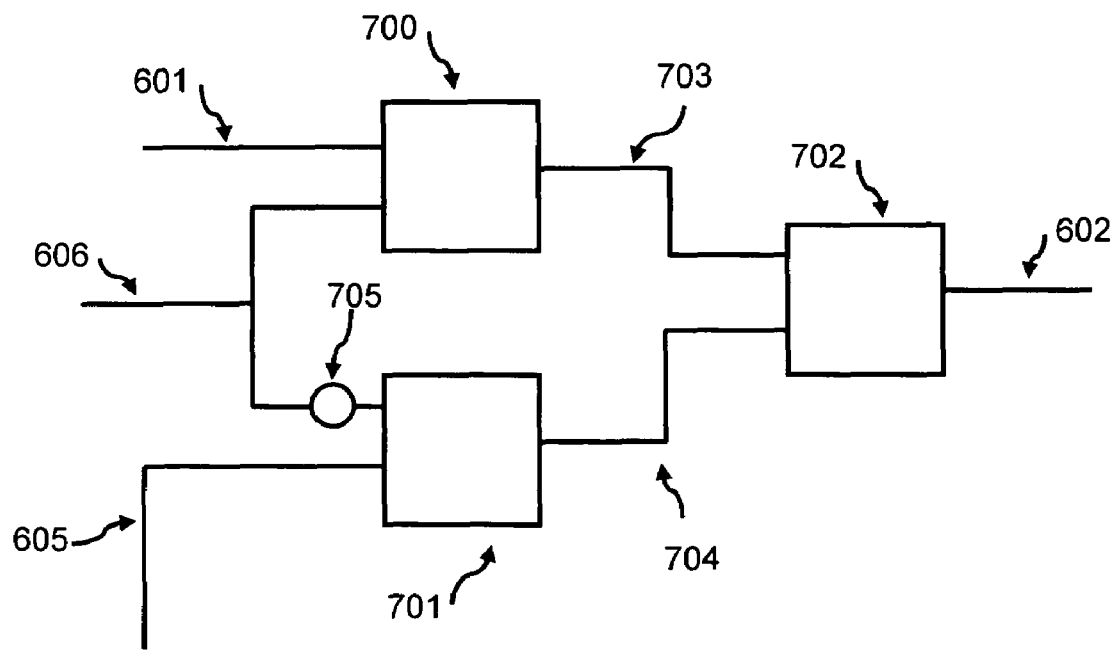
FIG. 15 is another diagram of an n-valued gating device.

Different ways to create a gating device or a gating function are possible. An additional example is provided in FIG. 15, wherein an inverter 705 is included, which inverts 0 to 1 and 1 to 0. Consequently devices 700 and 701 in FIG. 15 execute the same ternary logic function d1 of which the truth table was shown in the previous table.

Figure 16:
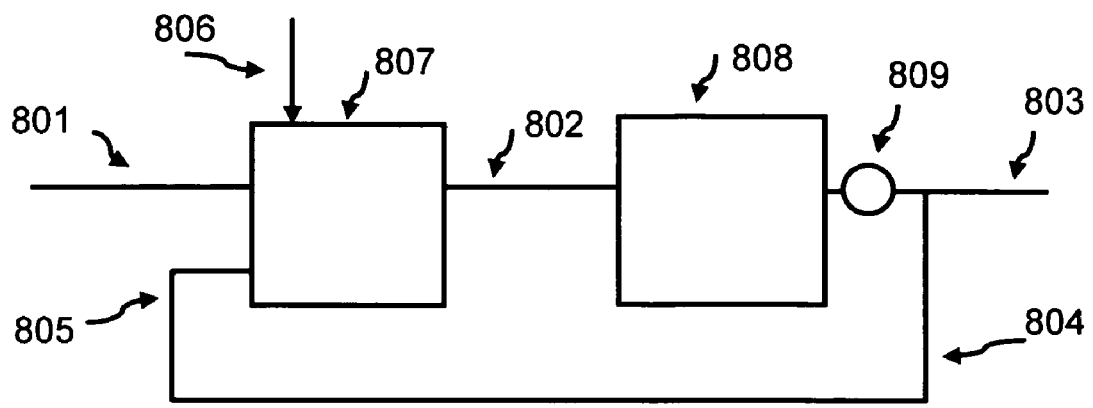
FIG. 16 is a diagram of an n-valued memory device comprised of a gating device and an n-valued information retaining device with a single independent input.

The information retaining device 608 in FIG. 13 can be replaced by a single element information retaining device 808. Because the output signal of such a device is usually an inverted version of its input signal, an inverter can be inserted to make the device of FIG. 13 an operable memory device. This is shown in FIG. 16, wherein an inverter 809 is inserted in the output 803. Such an inverter is required when single element device 808 with feedback executes ternary logic functions Ls1 or Ls2. Ternary logic function Ls3 does not create an inverted output signal and thus does not require an inverter 809.

Another way to achieve the inversion back to [0 1 2] is by adapting the gating device to the output signal on 803. When device 808 executes ternary logic functions Ls1 with feedback, the resulting output signal is [1 2 0] when its input is [0 1 2]. This can for instance be corrected in the gating device 807. Or in more detail this can be corrected in device 701 of FIG. 15. When the clock signal provided by input 606 is 1, it is made 0 by the inverter 705 and the device 701 should generate all 0 on its output 704, no matter what the signal is provided by 605. When the clock signal provided by 606 is low or 0, it is made 1 by inverter 705. The signal [1 2 0] provided by 605 should be transformed into [0 1 2] on output 704 by device 701. Consequently a truth table of the ternary logic function of device 701 that performs this aspect of the invention can have the following truth table:

|   | 0 | 1 | 2 |
|---|---|---|---|
| 0 | 0 | 2 | 0 |
| 1 | 0 | 0 | 1 |
| 2 | 0 | 1 | 0 |

The column for the signal provided by 606 (clock signal) is 2 will not occur and is a 'don't care column'.

The method applied for the illustrative ternary case can also be applied for creating any n-valued externally controlled memory device.

Further more the information retaining device 608 in FIG. 13 can be replaced by an n-valued delay device comprised of inverters as shown in FIGS. 7a and 7b.

An n-valued Logic Based (n−1) State Digital Memory Device Applying an nth State to Control Such a Device Another aspect of the present invention is a single n-valued digital element with feedback that will show the following properties:
- the element performs an n value digital logic function.
- it reaches stable, information retaining states, depending strictly on the current input for (n−1) states.
- it has one input state, not being one of the (n−1) stable information retaining states, which if applied will create the output as being the value of the preceding state. As such the device retains information about the previous input. Such a device has the same configuration as shown in FIG. 9.

A Ternary Logic Based Binary Digital Memory Device Applying a 3rd State to Control Such a Device The following table shows the truth tables of three ternary logic functions that can be used to realize a binary digital memory device with a third value to control the device.

| L1 | 0 | 1 | 2 | L2 | 0 | 1 | 2 | L3 | 0 | 1 | 2 |
|----|---|---|---|----|---|---|---|----|---|---|---|
| 0  | 0 | 2 | 0 | 0  | 0 | 0 | 2 | 0  | 0 | 2 | 0 |
| 1  | 2 | 1 | 1 | 1  | 1 | 2 | 1 | 1  | 1 | 2 | 1 |
| 2  | 0 | 1 | 0 | 2  | 2 | 0 | 1 | 1  | 2 | 0 | 1 | 2 |

The three ternary functions L1, L2 and L3 all will act as a binary information retaining device. When either one of ternary functions L1, L2 or L3 is applied in a device as shown in FIG. 9 and the signal provided by input 401 is 0, or 1 it will generate as a signal on output 403 a 0 or a 1. If the input signal is changed to 2 the signal on output 403 will remain '0' or '1' as the preceding state was. This is demonstrated in the following table by applying function L1 in the configuration of FIG. 9 and going through 3 cycles for each initial state and input state.

| input | initial state/ feedback | output | stability | cycle |
|-------|------------------------|--------|-----------|-------|
| 0 | 0 | 0 |        | cycle 1 |
| 0 | 0 | 0 |        | cycle 2 |
| 0 | 0 | 0 | stable | cycle 3 |
| 0 | 1 | 2 |        | cycle 1 |
| 0 | 2 | 0 |        | cycle 2 |
| 0 | 0 | 0 | stable | cycle 3 |
| 0 | 2 | 0 |        | cycle 1 |
| 0 | 0 | 0 |        | cycle 2 |
| 0 | 0 | 0 | stable | cycle 3 |
| 1 | 0 | 2 |        | cycle 1 |
| 1 | 2 | 1 |        | cycle 2 |
| 1 | 1 | 1 | stable | cycle 3 |
| 1 | 1 | 1 |        | cycle 1 |
| 1 | 1 | 1 |        | cycle 2 |
| 1 | 1 | 1 | stable | cycle 3 |
| 1 | 2 | 1 |        | cycle 1 |
| 1 | 1 | 1 |        | cycle 2 |
| 1 | 1 | 1 | stable | cycle 3 |
| 2 | 0 | 0 |        | cycle 1 |
| 2 | 0 | 0 |        | cycle 2 |
| 2 | 0 | 0 | stable | cycle 3 |
| 2 | 1 | 1 |        | cycle 1 |
| 2 | 1 | 1 |        | cycle 2 |
| 2 | 1 | 1 | stable | cycle 3 |

The first column of the table represents the value of the signal provided by input 401 in FIG. 9. The second column represents the initial state of the signal provided by 402 which will be replaced in the consecutive cycles by the value of the signal provided by 404 as result of new outputs. The third column represents the signal on output 403 of FIG. 9. For completeness the initial state 2 has also been included, though this output state should not occur. It is shown that the output state 2 is unstable and will always be changed to 0 or 1 with the functions L1, L2 or L3. The last two input states in the table are those wherein the input is 2. It is shown that the signal on 403 will not change and retain its last state. The circuit achieves stability in one complete switching cycle.

Figure 17:
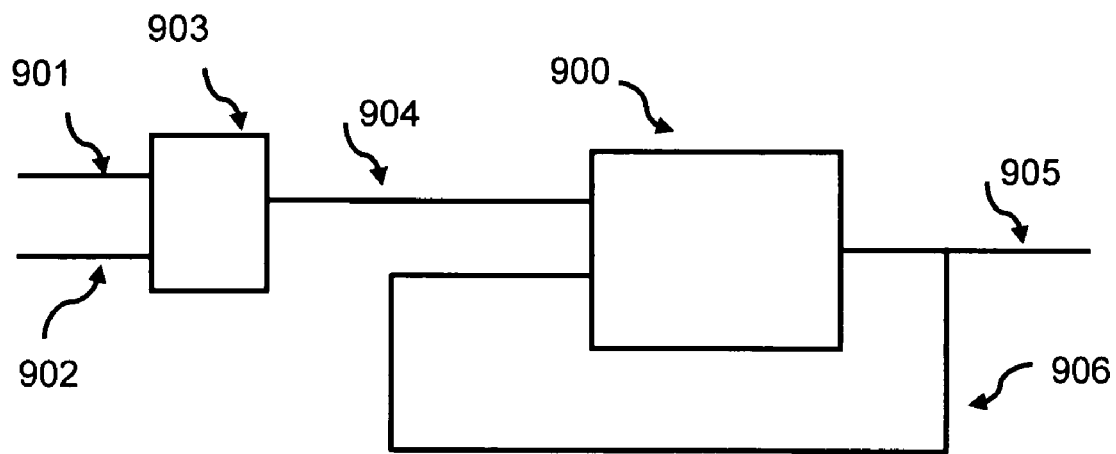
FIG. 17 is a diagram of an n-valued memory device with an (n+1)th state to control the device.

FIG. 17 shows a possible application of the method in a binary memory device. It applies a gating device 903 with ternary logic function S1. When the control signal on 901 is equal to 2 the gating device 903 will pass the value of the data signal on 902 to output 904. When the signal on 901 is not 2 the output of the gating device 904 is 2. When the input 904 to device 900 is 2 it retains on its output 905 its previous output as its current output. The following table shows the truth table of the ternary function S1 of the gating device 903.

| S1 | 0 | 1 | 2 |
|----|---|---|---|
| 0  | 2 | 2 | 0 |
| 1  | 2 | 2 | 1 |
| 2  | 0 | 1 | 2 |

It should be clear that S1 can be modified to retain or pass information on other conditions.

A 4-valued Logic Based Ternary Digital Memory Device Applying a 4th State to Control Such a Device The method also applies to single 4-valued logic functions, creating 3-value memory device with a fourth value for control. The truth tables of four commutative 4-valued functions that work this way are shown in the following table.

| Q1 | 0 | 1 | 2 | 3 | Q2 | 0 | 1 | 2 | 3 | Q3 | 0 | 1 | 2 | 3 | Q4 | 0 | 1 | 2 | 3 |
|----|---|---|---|---|----|---|---|---|---|----|---|---|---|---|----|---|---|---|---|
| 0  | 0 | 2 | 3 | 0 | 0  | 0 | 3 | 1 | 0 | 0  | 0 | 3 | 3 | 0 | 0  | 0 | 3 | 3 | 0 |
| 1  | 2 | 1 | 3 | 1 | 1  | 3 | 1 | 3 | 1 | 1  | 3 | 1 | 0 | 1 | 1  | 3 | 1 | 3 | 1 |
| 2  | 3 | 3 | 2 | 2 | 2  | 1 | 3 | 2 | 2 | 2  | 3 | 0 | 2 | 2 | 2  | 3 | 3 | 2 | 2 |
| 3  | 0 | 1 | 2 | 3 | 3  | 0 | 1 | 2 | 3 | 3  | 0 | 1 | 2 | 3 | 3  | 0 | 1 | 2 | 3 |

These configurations generate the output signal [0 1 2] and retain their previous value when the input signal is 3. The configuration with Q4 achieves stability in one switching cycle. The configurations with Q1, Q2 and Q3 achieve stability in 2 switching cycles.

There are also non-commutative functions that would work.

A 5-valued Logic Based 4-valued Digital Memory Device Applying a 5th State to Control Such a Device The method also applies to single 5-value logic functions, creating 4-valued memory device with a fifth value for control. Two of the commutative 5-value functions that work this way are shown in the following table.

| F1 | 0 | 1 | 2 | 3 | 4 | F2 | 0 | 1 | 2 | 3 | 4 |
|----|---|---|---|---|---|----|---|---|---|---|---|
| 0  | 0 | 2 | 3 | 4 | 0 | 0  | 0 | 4 | 4 | 4 | 0 |
| 1  | 2 | 1 | 4 | 4 | 1 | 1  | 4 | 1 | 4 | 4 | 1 |
| 2  | 3 | 4 | 2 | 1 | 2 | 2  | 4 | 4 | 2 | 4 | 2 |
| 3  | 4 | 4 | 1 | 3 | 3 | 3  | 4 | 4 | 4 | 3 | 3 |
| 4  | 0 | 1 | 2 | 3 | 4 | 4  | 0 | 1 | 2 | 3 | 4 |

The configuration with truth table F2 only requires 1 switching cycle to stabilize. The configuration with F1 requires 3 complete switching cycles to stabilize.

An n-Valued Logic Based (n–1)-value Digital Memory Device Applying an nth State to Control Such a Device The previous reasoning and method can be applied to create single function n-valued memory latches retaining (n–1) value digits and controlled by an nth value. There is a generic truth table for the n-valued logic function that creates a stable device in one switching cycle and provides the output signal [0 1 2 . . . (n–1)]. The generic truth table is provided in the following table.

| SWgen | 0   | 1   | 2   | . | . | . | n – 2 | n – 1 |
|-------|-----|-----|-----|---|---|---|-------|-------|
| 0     | 0   | n – 1 | n – 1 | . | . | . | n – 1 | 0 |
| 1     | n – 1 | 1 | n – 1 | . | . | . | n – 1 | 1 |
| 2     | n – 1 | n – 1 | 2 | . | . | . | n – 1 | 2 |
| .     | .   | .   | .   |   |   |   | .     | . |
| .     | .   | .   | .   |   |   |   | n – 1 | . |
| .     | .   | .   | .   |   |   |   |       | . |
| n – 2 | n – 1 | n – 1 | n – 1 | . | . | . | n – 2 | n – 2 |
| n – 1 | 0   | 1   | 2   | . | . | . | n – 2 | n – 1 |

Figure 18:
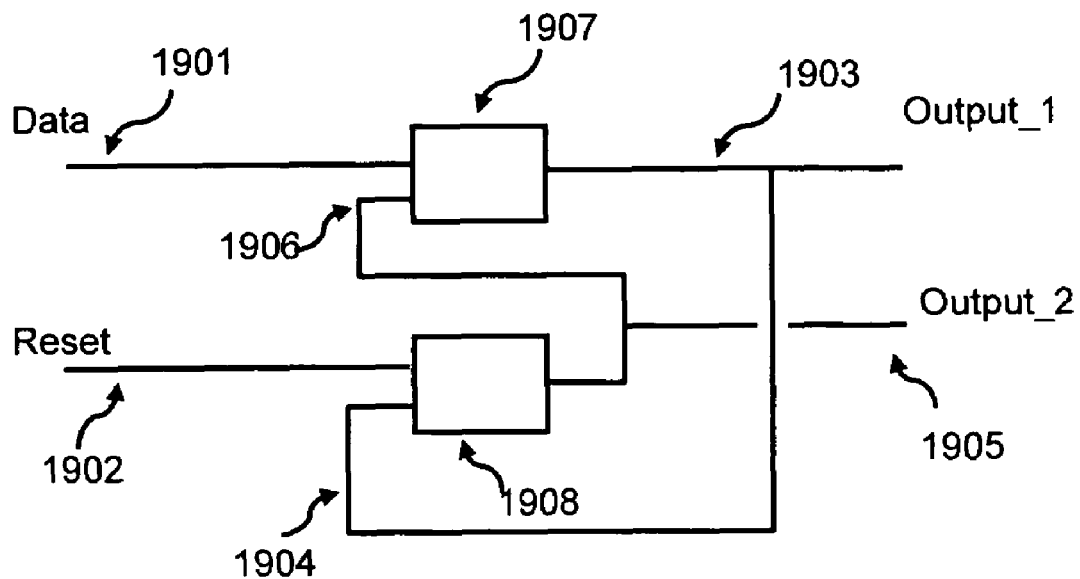
FIG. 18 is a diagram of an n-valued memory device with two independent inputs comprising two n-valued functions with feedback, of which the first input provides a Data signal and the second input provides a controlling Reset signal.

Method for Creating n-valued Digital Memory Devices Comprising Two n-valued Logic Functions and With Two Inputs: a Data Input and a Control or Reset input Another aspect of the present invention is the creation of a controlled n-valued memory device as shown in FIG. 18 with two n-valued functions 1907 and 1908 with feedback. The device has two inputs: 1901 with signal Data and 1902 with signal Reset. For the purpose of simplicity in use the here presented solutions will apply identical commutative functions. It should be clear that non-commutative as well as non-identical functions may also be applied. Also the order of the Data and Reset inputs may be changed in order without affecting the essence of the invention.

The signal Data on 1901 contains the information that needs to be retained in the device. The signal Data is an n-valued digital signal with n different states, its states will be represented as: 0, 1, 2, . . . (n–1).

The control signal Reset is also an n-valued digital signal. Just two of the n available values of Reset will be used.

The objective of the device is the following: When the signal Reset has a value Up (which is one of the following states: 0, 1, 2, . . . (n–1) ) at least one of the Outputs 1903 or 1905 will assume a stable value that is either the same or uniquely (through an n-valued reversible inversion) related to the input value of Data. When the value of the signal Reset changes to Down, (which is one of 0, 1, 2, . . . or (n–1) but not identical to the previous value Up) at least one of the outputs 1903 or 1905 will retain its value. When following this change of Reset the value of Data is changed, for instance to 0 then the value of the last output will still be retained.

It should be clear that the switching model in the configuration of FIG. 18 is the same as that in the configuration of FIG. 3 and applies the switching methods of table 300 in FIG. 4. The configuration FIG. 18 has two independent inputs of which one will be used as a data input and the other as a control input.

The Ternary Case

The following steps are applied to find the functions that will create the correct and stable configuration: (1) generate all ternary commutative logic functions, and (2) determine the functions which will generate output that is stable, consistent and uniquely contributable to a single value of Data (that is : each different value of Data generates a consistent value of Output_1 on 1903 or Output_2 on 1905) at a single value or state of Reset (in the example Reset=2), (3) change the value of Reset (in the example to Reset=0), (4) identify from the functions from step 2 those that will generate unique outputs depending on the outputs of step 2 related to the value of Data, (5) change the value of Data to 0 (absence of Data), (6) find from the functions of step 4 those functions where the outputs remain unchanged compared to (4).

The consecutive steps of the controlling process are shown in the following table.

| Step | Data signal 1901 | Reset 1902 | Output_1 1903 | Output_2 1905 |
|------|------------------|------------|---------------|---------------|
| 1    | In               | 2          | b1            | a1            |
| 2    | In               | 0          | b2            | a2            |
| 3    | 0                | 0          | b3            | a3            |

In the first step in the table Input 1901 of FIG. 18 has a signal In, while signal Reset at 1902 is 2. When the configuration of FIG. 18 is stabilized output 1903 has signal b1 and output 1905 has signal a1. At least one of the signals a1 and b1 must have a unique relationship with the value of In. In the next step the signal Reset is changed to 0 while signal In remains on input 901. The output signals may retain the same b1 and a1. They may also change to b2 and a2. However a unique relationship between one of a2 and b2 and In will exist. In the next step signal Data is changed to 0. The outputs retain the same signals b2 and a2 or change to b3 and a3 such that still one of the two signals has a unique relation to the original Data signal.

The result of executing the steps in the described method generates one ternary function Fn that will enable the configuration of FIG. 18. The truth table of that function is shown in the following table:

| Fn | 0 | 1 | 2 |
|---|---|---|---|
| 0 | 2 | 1 | 0 |
| 1 | 1 | 1 | 0 |
| 2 | 0 | 0 | 0 |

The stable states of this memory device are shown in the following table.

| Data | Reset | c1 | c2 | c3 | c4 | d1 | d2 | d3 | d4 | c0 | d0 |
|---|---|---|---|---|---|---|---|---|---|---|---|
| 0 | 2 | 2 | 2 | 2 | 2 | 0 | 0 | 0 | 0 | 0 | 0 |
| 0 | 2 | 1 | 2 | 2 | 2 | 0 | 0 | 0 | 0 | 0 | 1 |
| 0 | 2 | 0 | 2 | 2 | 2 | 0 | 0 | 0 | 0 | 0 | 2 |
| 0 | 2 | 2 | 2 | 2 | 2 | 0 | 0 | 0 | 0 | 1 | 0 |
| 0 | 2 | 1 | 2 | 2 | 2 | 0 | 0 | 0 | 0 | 1 | 1 |
| 0 | 2 | 0 | 2 | 2 | 2 | 0 | 0 | 0 | 0 | 1 | 2 |
| 0 | 2 | 2 | 2 | 2 | 2 | 0 | 0 | 0 | 0 | 2 | 0 |
| 0 | 2 | 1 | 2 | 2 | 2 | 0 | 0 | 0 | 0 | 2 | 1 |
| 0 | 2 | 0 | 2 | 2 | 2 | 0 | 0 | 0 | 0 | 2 | 2 |
| 1 | 2 | 1 | 1 | 1 | 1 | 0 | 0 | 0 | 0 | 0 | 0 |
| 1 | 2 | 1 | 1 | 1 | 1 | 0 | 0 | 0 | 0 | 0 | 1 |
| 1 | 2 | 0 | 1 | 1 | 1 | 0 | 0 | 0 | 0 | 0 | 2 |
| 1 | 2 | 1 | 1 | 1 | 1 | 0 | 0 | 0 | 0 | 1 | 0 |
| 1 | 2 | 1 | 1 | 1 | 1 | 0 | 0 | 0 | 0 | 1 | 1 |
| 1 | 2 | 0 | 1 | 1 | 1 | 0 | 0 | 0 | 0 | 1 | 2 |
| 1 | 2 | 1 | 1 | 1 | 1 | 0 | 0 | 0 | 0 | 2 | 0 |
| 1 | 2 | 1 | 1 | 1 | 1 | 0 | 0 | 0 | 0 | 2 | 1 |
| 1 | 2 | 0 | 1 | 1 | 1 | 0 | 0 | 0 | 0 | 2 | 2 |
| 2 | 2 | 0 | 0 | 0 | 0 | 0 | 0 | 0 | 0 | 0 | 0 |
| 2 | 2 | 0 | 0 | 0 | 0 | 0 | 0 | 0 | 0 | 0 | 1 |
| 2 | 2 | 0 | 0 | 0 | 0 | 0 | 0 | 0 | 0 | 0 | 2 |
| 2 | 2 | 0 | 0 | 0 | 0 | 0 | 0 | 0 | 0 | 1 | 0 |
| 2 | 2 | 0 | 0 | 0 | 0 | 0 | 0 | 0 | 0 | 1 | 1 |
| 2 | 2 | 0 | 0 | 0 | 0 | 0 | 0 | 0 | 0 | 1 | 2 |
| 2 | 2 | 0 | 0 | 0 | 0 | 0 | 0 | 0 | 0 | 2 | 0 |
| 2 | 2 | 0 | 0 | 0 | 0 | 0 | 0 | 0 | 0 | 2 | 1 |
| 2 | 2 | 0 | 0 | 0 | 0 | 0 | 0 | 0 | 0 | 2 | 2 |

The first column shows the value of Data and the second column shows the value of Reset. The column c1 means: the output signal on 1905 in FIG. 18 after 1 cycle. The table shows all elements in a row under c2, c3 and c4 to be identical. The same applies for the elements in a row under d2, d3 and d4. This means that at the second cycle the configuration of FIG. 18 with ternary function Fn has stabilized. The columns under c0 and d0 provide the initial conditions.

With Data=[0 1 2] and Reset=[2 2 2] the output signal on 1903 is [2 1 0] and the signal on 1905 is [0 0 0].

In the next phase the signal Data remains [0 1 2]. The signal Reset is changed to [0 0 0]. The stable output signals on 1903 and 1905 are the initial conditions for the next phase. This phase is shown in the following table.

| Data | Reset | c1 | c2 | c3 | c4 | d1 | d2 | d3 | d4 | c0 | d0 |
|---|---|---|---|---|---|---|---|---|---|---|---|
| 0 | 0 | 2 | 2 | 2 | 2 | 0 | 0 | 0 | 0 | 2 | 0 |
| 1 | 0 | 1 | 1 | 1 | 1 | 1 | 1 | 1 | 1 | 1 | 0 |
| 2 | 0 | 0 | 0 | 0 | 0 | 2 | 2 | 2 | 2 | 0 | 0 |

The table shows that the configuration stabilizes immediately. The output signal on 1903 remains the same [2 1 0]. However the output 'dn' on 1905 in FIG. 18 changes from [0 0 0] to [0 1 2] and reflects directly the Data signal on 1901.

The final step is to change the Data signal on input 1901 to [0 0 0]. The resulting output signals are provided in the following table.

| Data | Reset | c1 | c2 | c3 | c4 | d1 | d2 | d3 | d4 | c0 | d0 |
|---|---|---|---|---|---|---|---|---|---|---|---|
| 0 | 0 | 2 | 2 | 2 | 2 | 0 | 0 | 0 | 2 | 0 |
| 0 | 0 | 1 | 1 | 1 | 1 | 1 | 1 | 1 | 1 | 1 | 1 |
| 0 | 0 | 0 | 0 | 0 | 0 | 2 | 2 | 2 | 2 | 0 | 2 |

There is no change in the signals on outputs 1903 and 1905 of FIG. 18. The output 1903 provides [2 1 0] which is an inverted version of the original Data signal. Output 1905 provides signal [0 1 2] which is identical to the original Data signal. Consequently the configuration of FIG. 18 with ternary logic function Fn acts as a stable memory device which retains the original input signal when the Reset signal is changed from 2 to 0 and the Data signal is made 0.

The device with ternary function according to the configuration of FIG. 18 with function Fn appears to be a simpler realization of the Three State Latch described in U.S. Pat. No. 3,909,634 entitled: TERNARY STATE LATCH; by Maley et al. and granted Sep. 30, 1975. However the inventors of that device require 4 functions which are different from the ones used here to achieve the same performance.

Another ternary device with the same structure but a different ternary function may be applied by starting with Reset=1 (as opposed to Reset=2) and changing it to Reset=0.

The truth table of the ternary function Fn2 that will enable that configuration of FIG. 18 is provided in the following truth table:

| Fn2 | 0 | 1 | 2 |
|---|---|---|---|
| 0 | 1 | 0 | 2 |
| 1 | 0 | 0 | 0 |
| 2 | 2 | 0 | 2 |

Output 1903 in the configuration of FIG. 18 with ternary logic function Fn2 provides signal [1 0 2] when Reset=[0 0 0] and Data=[0 0 0] which is an inverted version of the original Data signal [0 1 2]. Output 1905 in the configuration of FIG. 18 with ternary logic function Fn2 provides signal [0 1 2] when Reset=[0 0 0] and Data=[0 0 0] which is identical to the original Data signal. Consequently the configuration of FIG. 18 with ternary logic function Fn2 acts as a stable memory device which retains the original input signal when the Reset signal is changed from 2 to 0 and the Data signal is made 0.

The 4-valued Case

According to another aspect of the invention the method here developed can be applied to the configuration of FIG. 18 having a 4-valued commutative logic function and the signals having 4 possible states. The following steps are applied to find the 4-valued commutative functions that will create the correct and stable configuration:
1. generate all 4-valued commutative logic functions.
2. determine the functions which will generate output that is stable, consistent and uniquely contributable to a single value of Data (that is, each different value of Data generates a unique value of Output_1 or Output_2) at a single value or state of Reset.
3. change the value of Reset (for example from Rest=3 to Reset=0).
4. identify from the functions from step 2 those that will generate signals on one of the ouputs 1903 and 1905 that are uniquely related to the value of Data.
5. change the value of Data to 0 (absence of Data).

|   | 0 | 1 | 2 | 3 |
|---|---|---|---|---|
| 0 | a | b | c | d |
| 1 | b | b |   |   |

-continued

|   | 0 | 1 | 2 | 3 |
|---|---|---|---|---|
| 2 | c |   | c |   |
| 3 | d |   |   | d | with a, b, c and d either 0, 1, 2 or 3.

A generic commutative form is then:

|   | 0 | 1 | 2 | 3 |
|---|---|---|---|---|
| 0 | a | b | c | d |
| 1 | b | b | e | f |
| 2 | c | e | c | g |
| 3 | d | f | g | d | with e, f and g also 0, 1, 2 or 3.

This will generate 16,384 commutative 4-valued functions, compliant with the structure of the sample truth table. The examples will build off of this group of functions, though it should be clear that other functions that fill the requirements may exist.

4-valued Memory Device With Changing Reset=3 to Reset=0

Applying the described method to the set of commutative 4-valued functions, starting with Reset=3 and changing to Reset=0 and then changing Data to 0 generates a number of 4-valued functions that will act as a memory device.

The truth tables of some of the 4-valued logic functions that enable this configuration are shown in the following tables.

| Q1 | 0 | 1 | 2 | 3 | Q2 | 0 | 1 | 2 | 3 | Q3 | 0 | 1 | 2 | 3 | Q4 | 0 | 1 | 2 | 3 |
|---|---|---|---|---|---|---|---|---|---|---|---|---|---|---|---|---|---|---|---|
| 0 | 3 | 1 | 2 | 0 | 0 | 3 | 1 | 2 | 0 | 0 | 3 | 1 | 2 | 0 | 0 | 3 | 1 | 2 | 0 |
| 1 | 1 | 1 | 0 | 0 | 1 | 1 | 1 | 1 | 0 | 1 | 1 | 1 | 1 | 2 | 1 | 1 | 1 | 2 | 0 |
| 2 | 2 | 0 | 2 | 0 | 2 | 2 | 1 | 2 | 0 | 2 | 2 | 1 | 2 | 0 | 2 | 2 | 2 | 2 | 0 |
| 3 | 0 | 0 | 0 | 0 | 3 | 0 | 0 | 0 | 0 | 3 | 0 | 2 | 0 | 0 | 3 | 0 | 0 | 0 | 0 |

| Q5 | 0 | 1 | 2 | 3 | Q6 | 0 | 1 | 2 | 3 | Q7 | 0 | 1 | 2 | 3 | Q8 | 0 | 1 | 2 | 3 |
|---|---|---|---|---|---|---|---|---|---|---|---|---|---|---|---|---|---|---|---|
| 0 | 3 | 1 | 2 | 0 | 0 | 3 | 1 | 2 | 0 | 0 | 3 | 2 | 1 | 0 | 0 | 3 | 2 | 1 | 0 |
| 1 | 1 | 1 | 2 | 0 | 1 | 1 | 1 | 1 | 3 | 1 | 2 | 2 | 0 | 0 | 1 | 2 | 2 | 1 | 0 |
| 2 | 2 | 2 | 2 | 1 | 2 | 2 | 3 | 2 | 0 | 2 | 1 | 0 | 1 | 0 | 2 | 1 | 1 | 1 | 0 |
| 3 | 0 | 0 | 1 | 0 | 3 | 0 | 0 | 0 | 0 | 3 | 0 | 0 | 0 | 0 | 3 | 0 | 0 | 0 | 0 |

| Fn4 | 0 | 1 | 2 | 3 | Q9 | 0 | 1 | 2 | 3 |
|---|---|---|---|---|---|---|---|---|---|
| 0 | 3 | 2 | 1 | 0 | 0 | 3 | 2 | 1 | 0 |
| 1 | 2 | 2 | 2 | 0 | 1 | 2 | 2 | 3 | 0 |
| 2 | 1 | 2 | 1 | 0 | 2 | 1 | 3 | 1 | 0 |
| 3 | 0 | 0 | 0 | 0 | 3 | 0 | 0 | 0 | 0 |

6. find from the functions of step 4 those functions where the outputs remain unchanged compared to 4 or retain a unique relation to the original input signal Data.

There are $4^{10}$ (4 to the power 10) commutative 4-valued functions. A relevant form of working functions can have the following structure:

The device with the configuration of FIG. 18 applying 4-valued function identified as Fn4 achieves stability in one switching cycle. With original input signal Data=[0 1 2 3] and Reset=[3 3 3 3], changing first the Reset signal on input 1902 to Reset=[0 0 0 0] and then changing the input signal on 1901 to [0 0 0 0] will retain a signal [3 2 1 0] on output 1903 and a signal [0 1 2 3] on output 1905. Consequently the function Fn4 enables a 4-valued memory device.

4-valued Memory Device Changing Reset=2 to Reset=0

The next series of functions can be generated by the described method on the 16,384 4-valued commutative functions by first applying Reset=2, then changing this to Reset=0 followed by Data=0. Functions that will enable the 4-valued memory device according to the configuration of FIG. 18 are:

```
Fn41  0  1  2  3    0  1  2  3    0  1  2  3    0  1  2  3

0     2  1  0  3    0  2  1  0    3  0  2  1    0  3  0  2  1  0  3
1     1  1  0  0    1  1  1  0    1  1  1  1    0  2  1  1  1  0  3
2     0  0  0  0    2  0  0  0    0  2  0  0    0  0  2  0  0  0  0
3     3  0  0  3    3  3  3  1    0  3  3  3    2  0  3  3  3  3  0  3

0  1  2  3    0  1  2  3    0  1  2  3    0  1  2  3

0     2  1  0  3    0  2  1  0    3  0  2  3    0  1  0  2  3  0  1
1     1  1  0  3    1  1  1  3    1  1  3  3    0  0  1  3  3  0  1
2     0  0  0  1    2  0  3  0    0  2  0  0    0  0  2  0  0  0  0
3     3  3  1  3    3  3  1  0    3  3  1  0    0  1  3  1  1  0  1

0  1  2  3    0  1  2  3

0     2  3  0  1    0  2  3  0  1
1     3  3  0  2    1  3  3  0  3
2     0  0  0  0    2  0  0  0  0
3     1  2  0  1    3  1  3  0  1
```

Applying the described method to these functions to the configuration of FIG. 18, starting with Reset=2 and changing to Reset=0 and then changing Data to 0 generates a number of functions, of which Fn1 is one, that will act as a memory device.

The device applying 4-valued function identified as Fn41 in the above table will generate [2 1 0 3] on output 1903 and [0 1 2 3] on 1905 in FIG. 18. The configuration achieves stability within 1 switching cycle after a change.

4-valued Reset=1 to Reset=0

A series of functions can be generated by the described method on the 16,384 4-valued commutative functions by first applying Reset=1, then changing this to Reset=0 followed by Data=0. The functions that will enable the FIG. 18 configuration are:

```
Fn42  0  1  2  3    0  1  2  3    0  1  2  3    0  1  2  3

0     1  0  2  3    1  0  2  3    1  0  2  3    1  0  2  3
1     0  0  0  0    0  0  0  0    0  0  0  0    0  0  0  0
2     2  0  2  3    0  2  0  2  1    2  0  2  2  2    0  2  3
3     3  0  0  3    3  0  1  3    3  0  2  3    3  0  3  3

0  1  2  3    0  1  2  3    0  1  2  3    0  1  2  3

0     1  0  2  3    1  0  2  3    1  0  3  2    1  0  3  2
1     0  0  0  0    0  0  2  0    0  0  0  0    0  0  0  0
2     2  0  2  3    2  0  2  3    3  0  3  0    3  0  3  1
3     3  0  3  3    3  2  3  3    2  0  0  2    2  0  1  2

0  1  2  3    0  1  2  3

0     1  0  3  2    1  0  3  2
1     0  0  0  0    0  0  0  0
2     3  0  3  2    3  0  3  3
3     2  0  2  2    2  0  3  2
```

These functions applied to the configuration of FIG. 18, starting with Reset=1 and changing to Reset=0 and then changing Data to 0 will create stable memory devices.

The device with the configuration of FIG. 18 applying 4-valued function identified as Fn42 in the above table will generate a signal [1 0 2 3] on output 1903 when Data=[0 0 0 0] and Reset=[0 0 0 0] and starting with Data=[0 1 2 3] and Reset=[1 1 1 1]. A signal [0 1 2 3] will be provided on output 1905 when Data=[0 0 0 0] and Rest=[0 0 0 0].

Applying change of Reset and Data at the same time may create instability or inconsistent results. The method described here should allow enough time between changes in states until stability is achieved before consecutive changes are initiated.

The n-valued Case:

The enablement for 3 and 4-valued memory devices described here are merely illustrative examples of this method. The method applies to any n-valued logic memory device, using this configuration.

As many apparently different embodiments of this invention may be made without departing from the spirit and scope thereof, it is to be understood that the invention is not limited to the specific embodiments thereof.

One part of the embodiment of the inventions explained in this application is the actual realization of the ternary, 4-valued and any other n-valued logic function.

One embodiment of the execution of the multi-valued logic functions is by way of gates and inverters. This method is demonstrated in FIG. 10 and FIG. 11 for the ternary case. An extensive description of the realization of n-valued logic functions can be found in: U.S. Non-Provisional Patent Application No. 10/935,960, filed on Sep. 8, 2004, entitled TERNARY AND MULTI-VALUE DIGITAL SCRAMBLERS, DESCRAMBLERS AND SEQUENCE GENERATORS and U.S. Non-Provisional Patent Application No. 11/000,218, filed Nov. 30, 2004, entitled SINGLE AND COMPOSITE BINARY AND MULTI-VALUED LOGIC FUNCTIONS FROM GATES AND INVERTERS which are hereby incorporated by reference in their entirety.

The True n-valued Latch

According to another aspect of the present invention it is possible to design and realize ternary, 4-valued and n-valued latches. These latches have multiple inputs and multiple outputs. Certain combinations of input signals will create consistent and stable and directly related output signals, no matter what the initial conditions are. The stable output signals are the initial conditions for a changing input signal. One combination of input signals will retain the information of the previous inputs signals. Such a device that retains information despite changing input signals is called an n-valued latch, when the input signals can assume 1 of n-states.

The Ternary Case

According to one aspect of the present invention it is possible to design and realize a ternary or 3-valued logic memory element or latch.

Figure 19:
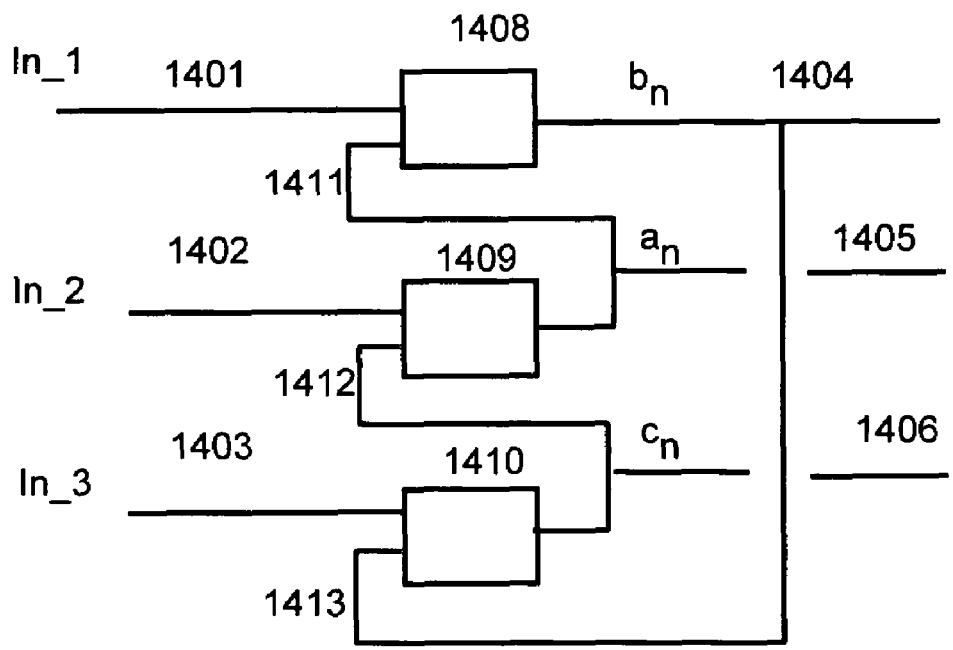
FIG. 19 shows a diagram of a 3-function information retaining device with feedback.

In order to design 3-valued latching devices the switching model of FIG. 4 will be extended to describe three logic devices with feedback as shown in FIG. 19. An additional switching device has been added to the configuration compared to the configuration of FIG. 3. The configuration as shown in FIG. 19 now comprises three ternary switching devices of which each executes a ternary logic function. It is assumed that each function completes a switch in a different time, though this is for illustrative purposes only. It does not matter if each switches in a same time.

The algorithmic model for the device of FIG. 19 is:

stable situation:
b0=In_1_old θ1 a0
a0=In_2_old θ2 c0
c0=In_3_old θ3 b0
first cycle
b1=In_1 θ1 a0
a1=In_2 θ2 c0
c1=In_3 θ3 b0
c2=In_3 θ3 b1
b2=In_1 θ1 a1
a2=In_2 θ2 c1
c3=In_3 θ3 b2
a3=In_2 θ2 c2
b3=In_1 θ1 a2

In the expressions θ1 indicates the ternary logic function of device 1408 of FIG. 19; θ2 indicates the ternary logic function executed by device 1409 and θ3 is the ternary logic function of device 1410.

Figure 20:
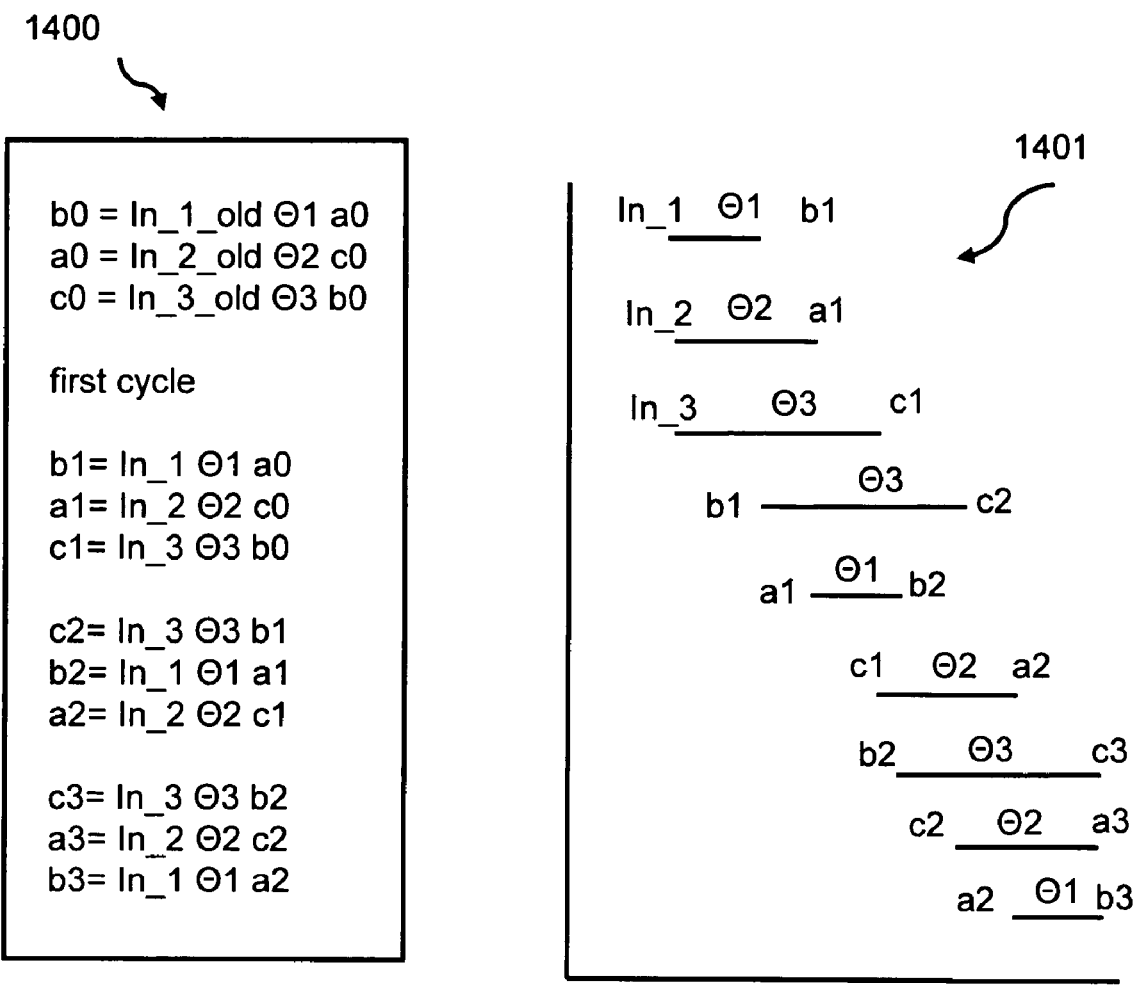
FIG. 20 shows the symbolic expression of the switching model of the 3 element device of FIG. 19 in a table and the time line of the switching model in a graph.

Table 1400 of FIG. 20 shows also the expressions and graph 1401 shows the timelines. It is clear that completion of a complete cycle requires 3 times 3 individual switching events. While the model requires more expressions to be executed than the binary case, the conditions for determining stability are the same. Consecutive signals on an output should be identical for the circuit to be stable.

Another requirement is that the relevant output signals should be uniquely related to the input signals.

There are 3×3×3 or 27 different combinations possible for initial conditions (b0, a0, c0). There are also 3×3×3 or 27 different combinations of the input signals (In_1, In_2, In_3) possible.

The ternary latch as shown in FIG. 19 is a device with three inputs and three outputs. In order to find the ternary logic functions that will create a latch the following conditions will be applied:

1. at least 3 different combinations of input signals In_1, In_2 and In_3 to inputs 1401, 1402 and 1403 of the circuit of FIG. 19 will generate stable output signals on outputs 1404, 1405 and 1406.
2. each stable combination of output signals will be uniquely related to a combination of input signals;
3. each stable and uniquely related combination of output signals will be independent of the initial conditions of the circuit;
4. at least one combination of input signals exist, wherein at least 3 different combinations of stable outputs signals are generated, wherein each stable combination of output signals depends on a unique initial condition of the circuit of FIG. 19;

The configuration of FIG. 19 that fulfills the above conditions wherein the output conditions 2 and 3 are the same as the initial conditions of 4 then realizes a ternary latch.

The configuration of FIG. 19 with devices 1408, 1409 and 1410 all executing the ternary logic function Latch31 will realize a true ternary latch. The following table provides the truth table for Latch31.

| Latch31 | 0 | 1 | 2 |
|---|---|---|---|
| 0 | 1 | 1 | 1 |
| 1 | 1 | 1 | 2 |
| 2 | 1 | 2 | 0 |

The following table shows the switching table for the configuration of FIG. 19 with ternary logic function Latch32.

| In_1 | In_2 | In_3 | bn | an | cn | b0 | a0 | c0 |
|---|---|---|---|---|---|---|---|---|
| 0 | 2 | 2 | 1 | 0 | 2 | any | any | any |
| 2 | 0 | 2 | 2 | 1 | 0 | any | any | any |
| 2 | 2 | 0 | 0 | 2 | 1 | any | any | any |
| 2 | 2 | 2 | 0 | 2 | 1 | 0 | 2 | 1 |
| 2 | 2 | 2 | 1 | 0 | 2 | 1 | 0 | 2 |
| 2 | 2 | 2 | 2 | 1 | 0 | 2 | 1 | 0 |

The switching table shows the execution of the switching model of table 1400 of FIG. 20. It also shows what a latch actually does: it "remembers" how inputs are different from each other. Each of the stable input combinations (0,2,2), (2,0,2) and (2,2,0) generates a unique output combination which will be generated for any initial condition. A stable output situation is the initial condition for the next input combination.

The situation wherein just one of the inputs changes in value is advantageous compared to changing two input values. While measures can be taken to make sure that two or three input signals change at the same time, any time difference between input signal change may upset the initial conditions, thus destroying the proper latching performance of the circuit.

Input signal combinations different from the ones provided in the switching table may be considered "forbidden" states for this configuration.

For the configuration to work as a single digit memory element a "translation" circuit is needed that will generate for instance (0,2,2) for memory state 0, (2,0,2) for memory state 1 and (2,2,0) for memory state 2.

With those input signals the output signal an on output 1405 will directly generate the stored digit when the input signal combination is (2,2,2).

Like in the binary case where the NAND and NOR enable the binary latch there are different ternary functions exist that will enable a ternary latching device and have different memory and forbidden states. One other enabling ternary function is Latch32 for which the truth table is provided in the following table.

| Latch32 | 0 | 1 | 2 |
|---|---|---|---|
| 0 | 2 | 0 | 1 |
| 1 | 0 | 1 | 1 |
| 2 | 1 | 1 | 1 |

The switching table according to the switching model of FIG. 20 is provided in the following table.

| In__1 | In__2 | In__3 | bn | an | cn | b0 | a0 | c0 |
|---|---|---|---|---|---|---|---|---|
| 2 | 0 | 0 | 1 | 2 | 0 | any | any | any |
| 0 | 2 | 0 | 0 | 1 | 2 | any | any | any |
| 0 | 0 | 2 | 2 | 0 | 1 | any | any | any |
| 0 | 0 | 0 | 1 | 2 | 0 | 1 | 2 | 0 |
| 0 | 0 | 0 | 0 | 1 | 2 | 0 | 1 | 2 |
| 0 | 0 | 0 | 2 | 0 | 1 | 2 | 0 | 1 |

To create a memory device from a latch according to the configuration of FIG. 19 with ternary function Latch32 a 0 can be translated into (0,2,0) a 1 into (2,0,0) and a 2 into (0,0,2). The reason for this translation or coding is shown in the following table.

| In | In__1 | In__2 | In__3 | bn | an | cn | b0 | a0 | c0 | Out = bn |
|---|---|---|---|---|---|---|---|---|---|---|
| 0 | 0 | 2 | 0 | 0 | 1 | 2 | any | any | any | 0 |
| 1 | 2 | 0 | 0 | 1 | 2 | 0 | any | any | any | 1 |
| 2 | 0 | 0 | 2 | 2 | 0 | 1 | any | any | any | 2 |
| — | 0 | 0 | 0 | 0 | 1 | 2 | 0 | 1 | 2 | 0 |
| — | 0 | 0 | 0 | 1 | 2 | 0 | 1 | 2 | 0 | 1 |
| — | 0 | 0 | 0 | 2 | 0 | 1 | 2 | 0 | 1 | 2 |

By using this translation it is not needed to translate or combine the output signals as the output 1404 (with signal bn) will provide the correct signal corresponding with the original input signal In.

Figure 21:
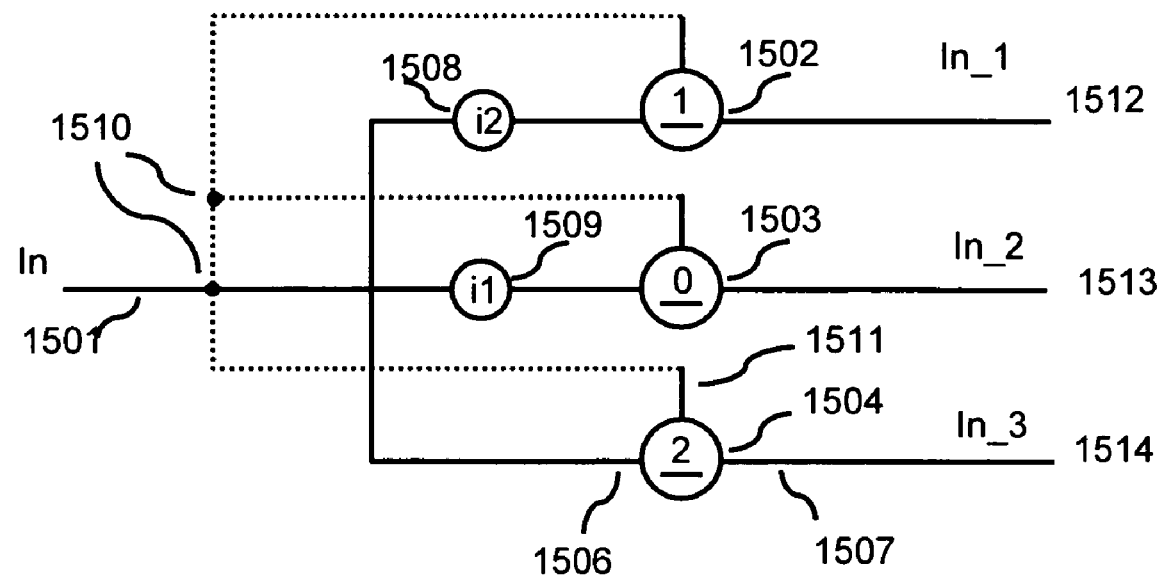
FIG. 21 shows a diagram of a 3-valued signal translation device.

One possible way to realize an input signal translation circuit is shown in FIG. 21. The circuit comprises ternary individually controlled gates such as 1504 in FIG. 21.

The second component is the ternary inverter, drawn as a circle with a number inside. Drawn inverters in FIG. 21 are 1508 and 1509. Inverter 1508 is inverter i2=(1 2 0) which can also be described as (1 2 0)=[0 1 2]→[1 2 0].

Inverter i2 (1509 in FIG. 21) is (2 0 1).

The connections between the control inputs of individually controlled gates 1502, 1503 and 1504 are drawn as dotted lines for illustrative purposes to distinguish them from other connections. Dots 1510 signify hard connections.

Consequently, (assuming that 0 is represented by "absence of signal") when the signal In provided by input 1501 is a 0 then gate 1503 is conducting and gates 1502 and 1504 are non-conducting and will generate a 0 on ouputs 1512 and 1514. Inverter 1509 (i1) will change the signal from 0 to 2 and will output a 2 on 1513. Consequently when In=0 the combination (In__1, In__2, In__3) will be (0,2,0).

When In is 1, then output 1513 and 1514 will generate a 0 while 1512 will generate a 2; (In__1, In__2, In__3) will be (2,0,0); when In=2 then outputs 1512 and 1513 will generate a 0 while 1514 will generate a 2 and (In__1, In__2, In__3) will be (0,0,2).

Figure 22:
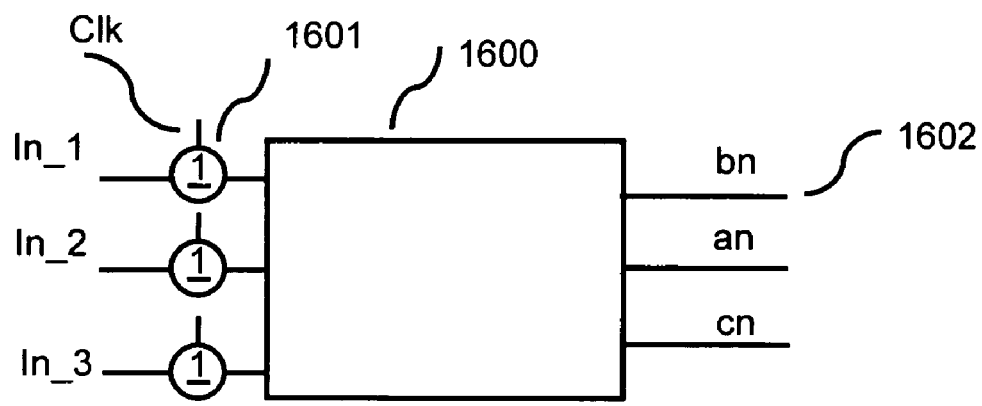
FIG. 22 shows a block diagram of a 3-valued latch.

To make sure that in the "store" mode all input signals are 0 one can apply a circuit as shown in FIG. 22. In the diagram of FIG. 22 1600 represents the ternary latch according to the configuration of FIG. 19 with ternary function Latch 32. The input signals In$_1$, In__2 and In__3 are provided by the circuit of FIG. 21. The circuit of FIG. 22 has in each of its three inputs an individually controlled gate which is conducting for control signal is 1. The control signals are provided by a clock signal "Clk" that can be 1 or not 1 (for instance 0). So when the signal "Clk" is 1, the value of the input signals depends on the signals provided by the translation circuit of FIG. 21 and ultimately on the "to be stored" data signal In. The value of signal In is also generated on output 1602 (or signal bn) of the circuit of FIG. 19.

When the value of the signal "Clk" is changed to NOT 1 (for instance 0) then all input signals to the circuit of FIG. 22 change to 0 and the signal generated on 1602 will reflect the last data input In.

The 4-value Case.

Figure 23:
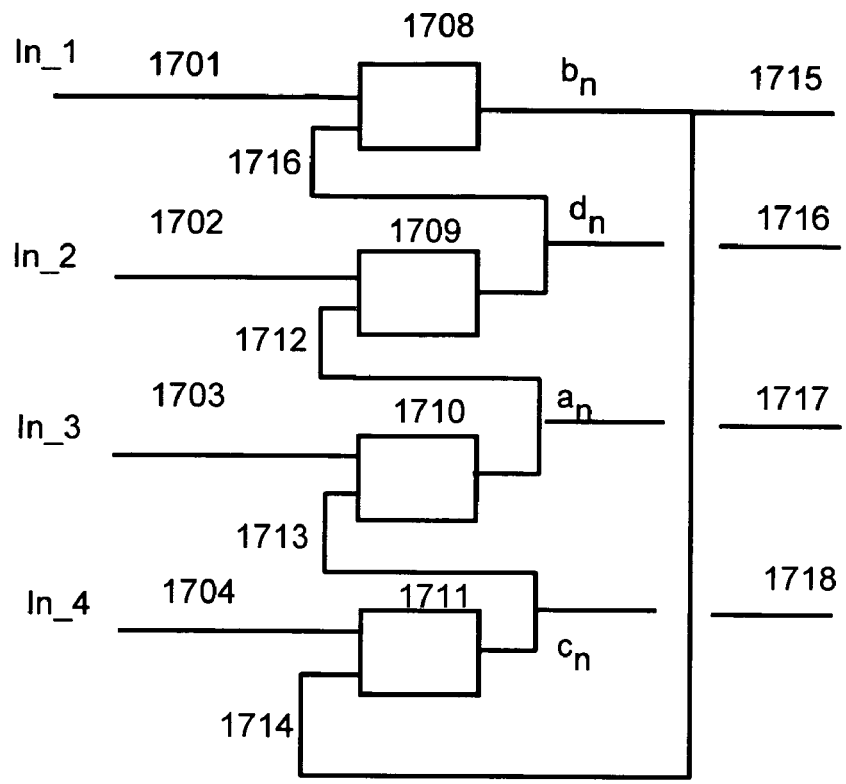
FIG. 23 shows a diagram of a 4-function information retaining device with feedback.

According to another aspect of the present invention the method using the switching model and conditions regarding stability correctness and initial settings also applies to the 4-valued case. It requires the change of the basic configuration to the circuit of FIG. 23 comprised of 4 4-valued functions with feedback. It also requires inclusion of an additional switching step in the switching model for the 4-valued case. The algorithmic model for the 4-valued latch as shown in FIG. 23 is:

stable situation:

b0=In__1_old θ1 d0 d0=In__2_old θ2 a0 a0=In__3_old θ3 c0 c0=In__4_old θ4 b0 first complete cycle b1=In__1 θ1 d0 d1=In__2 θ2 a0 a1=In__3 θ3 c0 c1=In__4 θ4 b0 b2=In__1 θ1 d1 d2=In__2 θ2 a1 a2=In__3 θ3 c1 c2=In__4 θ4 b1 b3=In__1 θ1 d2 d3=In__2 θ2 a2 a3=In_3 θ3 c2
c3=In_4 θ4 b2
b4=In_1 θ1 d3
d4=In_2 θ2 a3
a4=In_3 θ3 c3
c4=In_4 θ4 b3

The device 1708 in FIG. 22 executes 4-valued logic function θ1; device 1709 executes θ2; device 1710 executes θ3 and 1711 executes 4-valued logic function θ4.

It is clear that completion of a cycle requires 4 times 4 individual switching events. While the 4-valued model requires more expressions to be executed than the ternary, the conditions for determining stability are the same. That is consecutive signals on an output should be identical for the circuit to be stable.

Another requirement is that the relevant output signals should be uniquely related to the input signals.

There are 4×4×4×4 or 256 different combinations possible for initial conditions (b0, d0, a0, c0). There are also 4×4×4×4 or 256 different combinations for (In_1, In_2, In_3, In_4).

The 4-valued latch is shown in diagram in FIG. 23. The 4-valued latch is a device with four inputs and four outputs. In order to find the 4-valued logic functions that will create a latch the following conditions will be applied:

1. at least 4 different combinations of input signals In_1, In_2, In_3 and In_4 to inputs 1701, 1702, 1703 and 1704 of the circuit of FIG. 23 will generate stable output signals on outputs 1715, 1716, 1717 and 1718.
2. each stable combination of output signals will be uniquely related to a combination of input signals;
3. each stable and uniquely related combination of output signals will be independent of the initial conditions of the circuit;
4. at least one combination of input signals exist, wherein at least 4 different combinations of stable outputs signals are generated, wherein each stable combination of output signals depends on a unique initial condition of the circuit of FIG. 23;

The configuration of FIG. 23 that fulfills the above conditions wherein the output conditions 2 and 3 are the same as the initial conditions of 4 then realizes a 4-valued latch.

A device with a diagram as shown in FIG. 23 with the individual devices executing a 4-valued logic function Latch 41 will realize a 4-valued latch. The truth table of Latch41 is shown in the following table.

| Latch41 | 0 | 1 | 2 | 3 |
|---|---|---|---|---|
| 0 | 1 | 1 | 1 | 1 |
| 1 | 1 | 1 | 1 | 2 |
| 2 | 1 | 1 | 2 | 3 |
| 3 | 1 | 2 | 3 | 0 |

The following 4-valued switching table shows the output signals as a result of specific input signals and input conditions.

| In | In_1 | In_2 | In_3 | In_4 | bn | dn | an | cn | b0 | d0 | a0 | c0 | Out = dn |
|---|---|---|---|---|---|---|---|---|---|---|---|---|---|
| 0 | 0 | 3 | 3 | 3 | 1 | 0 | 3 | 2 | any | any | any | any | 0 |
| 1 | 3 | 0 | 3 | 3 | 2 | 1 | 0 | 3 | any | any | any | any | 1 |
| 2 | 3 | 3 | 0 | 3 | 3 | 2 | 1 | 0 | any | any | any | any | 2 |
| 3 | 3 | 3 | 3 | 0 | 0 | 3 | 2 | 1 | any | any | any | any | 3 |
| — | 3 | 3 | 3 | 3 | 1 | 0 | 3 | 2 | 1 | 0 | 3 | 2 | 0 |
| — | 3 | 3 | 3 | 3 | 2 | 1 | 0 | 3 | 2 | 1 | 0 | 3 | 1 |
| — | 3 | 3 | 3 | 3 | 3 | 2 | 1 | 0 | 3 | 2 | 1 | 0 | 2 |
|   | 3 | 3 | 3 | 3 | 0 | 3 | 2 | 1 | 0 | 3 | 2 | 1 | 3 |

This configuration is advantageous because only one input signal has to change to represent a data input signal. In this configuration the output 1716 of FIG. 23 can serve as the device output as signal dn represents directly the related data input signal.

The workings of this latch should be clear: (In_1, In_2, In_3, In_4)=(0, 3, 3, 3) represents In=0; (In_1, In_2, In_3, In_4)=(3, 0, 3, 3) represents In=1; (In_2, In_3, In_4)=(3, 3, 0, 3) represents In=2 and (In_1, In_2, In_3, In_4)=(3, 3, 3, 0) represents In=3. When input combination (In_1, In_2, In_3, In_4) is switched to (3, 3, 3, 3) the value of the last input is stored and presented on output 1716.

Other 4-valued functions can also enable a 4-valued latch. An illustrative example of another 4-valued logic function enabling a 4-valued latch is the function Latch42 of which the truth table is provided in the following table.

| Latch41 | 0 | 1 | 2 | 3 |
|---|---|---|---|---|
| 0 | 3 | 0 | 1 | 2 |
| 1 | 0 | 1 | 2 | 2 |
| 2 | 1 | 2 | 2 | 2 |
| 3 | 2 | 2 | 2 | 2 |

The switching table of the 4-valued latch enabled by Latch42 is provided in the following table.

| In | In_1 | In_2 | In_3 | In_4 | bn | dn | an | cn | b0 | d0 | a0 | c0 | Out = bn |
|---|---|---|---|---|---|---|---|---|---|---|---|---|---|
| 0 | 0 | 0 | 3 | 0 | 0 | 1 | 2 | 3 | any | any | any | any | 0 |
| 1 | 0 | 3 | 0 | 0 | 1 | 2 | 3 | 0 | any | any | any | any | 1 |
| 2 | 3 | 0 | 0 | 0 | 2 | 3 | 0 | 1 | any | any | any | any | 2 |

-continued

| In | In_1 | In_2 | In_3 | In_4 | bn | dn | an | cn | b0 | d0 | a0 | c0 | Out = bn |
|---|---|---|---|---|---|---|---|---|---|---|---|---|---|
| 3 | 0 | 0 | 0 | 3 | 3 | 0 | 1 | 2 | any | any | any | any | 3 |
| — | 0 | 0 | 0 | 0 | 0 | 1 | 2 | 3 | 0 | 1 | 2 | 3 | 0 |
| — | 0 | 0 | 0 | 0 | 1 | 2 | 3 | 0 | 1 | 2 | 3 | 0 | 1 |
| — | 0 | 0 | 0 | 0 | 2 | 3 | 0 | 1 | 2 | 3 | 0 | 1 | 2 |
|   | 0 | 0 | 0 | 0 | 3 | 0 | 1 | 2 | 3 | 0 | 1 | 2 | 3 |

Figure 24:
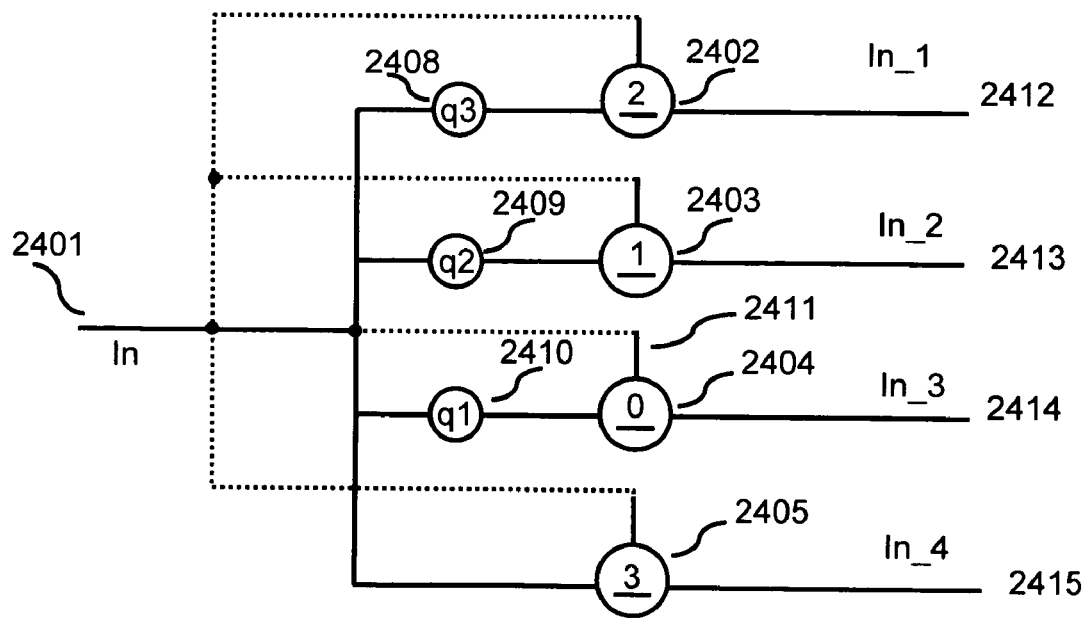
FIG. 24 shows a diagram of a 4-valued signal translation device.

The circuit of FIG. 24 can be used to generate the appropriate input signal combinations from an input signal In. The circuit is comprised of individually controlled 4-valued gates (2402, 2403, 2404 and 2405) and 4-valued inverters q1 (2410), q2 (2409) and q3 (2408). The signal "In" (which can be 0, 1 , 2 or 3) is provided on input 2401 and is the to be processed signal that will be provided on the outputs 2412, 2413, 2414 and 2415 and also serves as the control signals for the gates. When In=0, according to the switching table, only output 2114 should provide a 3. The other outputs should provide a 0. When In=0 only gate 2404 is conducting. The inverter q2 has to change input signal In=0 into a 3. Consequently inverter q1 can be (3 0 1 2). When In=1, according to the switching table, only output 2413 should provide a 3 and all other outputs should provide a 0. Inverter 2409 (q2) should change a 1 into a 3 and can be (2 3 0 1). When In=2, according to the switching table, only output 2412 should provide a 3 and all other outputs should provide a 0. Inverter 2408 (q3) should change a 2 into a 3 and can be (1 2 3 0). When In=3 only output 2415 will generate a 3, all other outputs will generate a 0. The example assumes that state 0 is represented by "absence of signal".

Applying the translation circuit of FIG. 24 then assures that the value of In is directly reflected (without need for translation) on output 1715 of FIG. 23 providing bn.

The n-valued Latch

According to another aspect of the present invention it is possible to create a general n-valued latch configuration comprising n n-valued logic functions with feedback.

Based on the general n-valued latch a general n-valued latch algorithmic switching model can be created, comprising n cycles of n individual switching expressions, each expression determining the result of a single switching event for each individual switching device.

The n-valued latch should comply with the following conditions: Completion of a complete cycle requires n times n individual switching events. Consecutive signals on an output should be identical for the circuit to be stable. The relevant output signals should be uniquely related to the input signals.

There are $n^n$ different combinations possible for initial conditions. There are also $n^n$ different combinations for input signals.

The n-valued latch is a device with n inputs and n outputs. In order to find the n-valued logic functions that will create a latch the following conditions will be applied:
1. at least n different combinations of input signals will generate stable output signals on the outputs.
2. each stable combination of output signals will be uniquely related to a combination of input signals;
3. each stable and uniquely related combination of output signals will be independent of the initial conditions of the circuit;
4. at least one combination of input signals exist, wherein at least n different combinations of stable outputs signals are generated, wherein each stable combination of output signals depends on a unique initial condition of the latching circuit;

The configuration of the n-valued device that fulfills the above conditions wherein the output conditions 2 and 3 are the same as the initial conditions of 4 then realizes an n-valued latch.

One of the generic n-valued logic functions that will enable an n-valued latch is Latchn1 of which the truth table is shown in the following table.

| Latchn1 | 0 | 1 | 2 | 3 | . | . | . | n−2 | n−1 |
|---|---|---|---|---|---|---|---|---|---|
| 0 | 1 | 1 | 1 | 1 | . | . | . | 1 | 1 |
| 1 | 1 | 1 | 1 | . | . | . | . | 1 | 2 |
| 2 | 1 | 1 | .. | . | . | . | . | 2 | 3 |
| 3 | 1 | . | . | . | . | . | . | 3 | 4 |
| . | . | . | . | . | . | . | . | 4 | . |
| . | . | . | . | . | . | . | . | . | . |
| . | . | . | . | . | 3 | . | . | . | n−2 |
| n−2 | 1 | 1 | 2 | 3 | 4 | . | . | n−2 | n−1 |
| n−1 | 1 | 2 | 3 | 4 | . | . | n−2 | n−1 | 0 |

Figure 25:
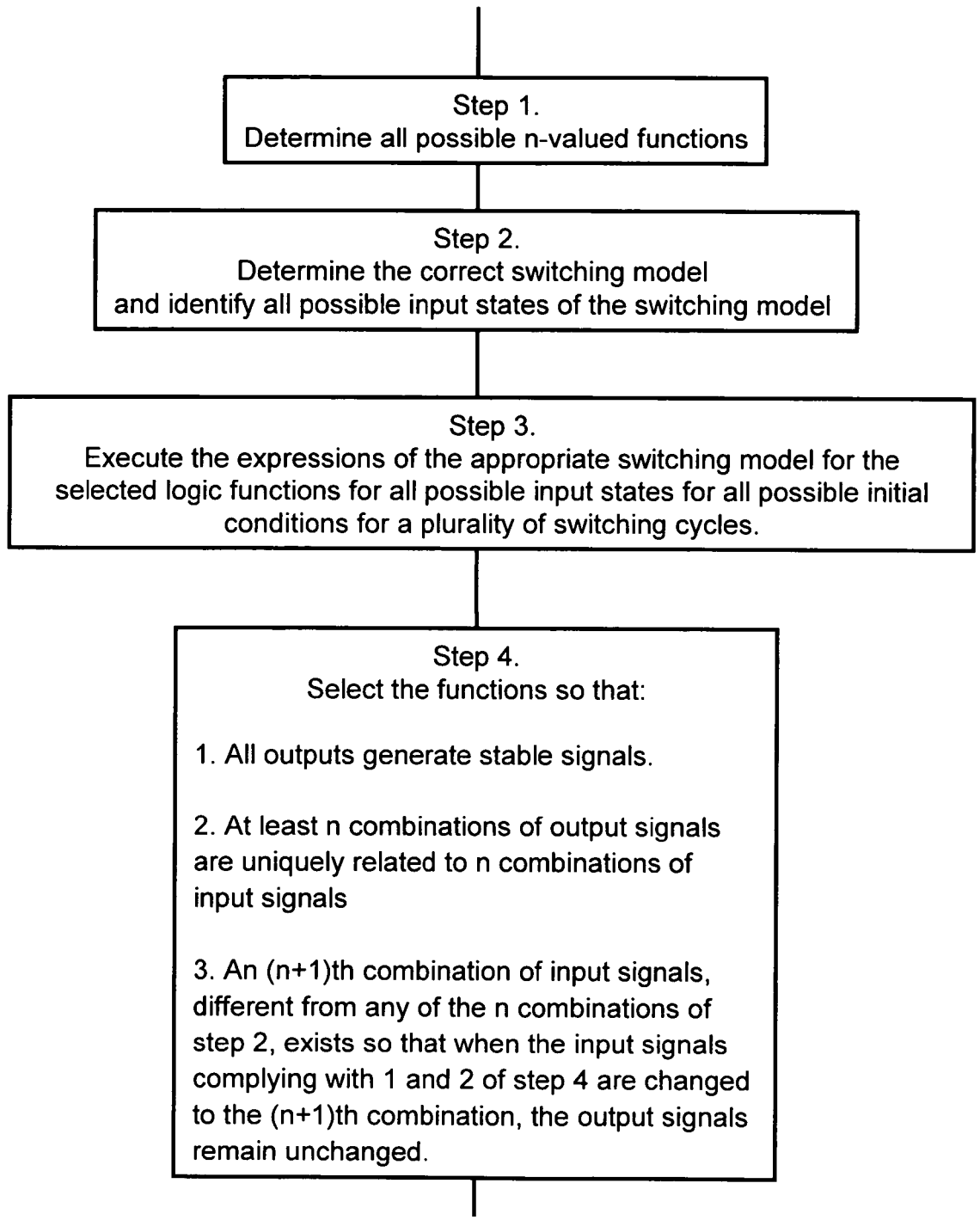
FIG. 25 is a flow diagram of the method to create true n-valued latches.

The method to design and create true n-valued latches is shown in the flow diagram of FIG. 25 and involves 4 major steps:

Step 1 of the method comprises the generation of all relevant logic functions. It may include or exclude for instance the non-commutative logic functions.

Step 2 of the method comprises determining the correct switching model. As was shown an n-valued true latch will have n logic elements with feedback and a complete cycle will involve n×n switching expressions and n initial condition expressions.

Step 3 of the method comprises the execution of the n-valued switching model for an n-valued true latch, for all possible input conditions and initial conditions for selected functions.

Step 4 of the method includes the identification of the presence of n stable combinations of input signals of which each combination will generate a unique combination of output signals for any initial condition. Step 4 also includes identifying a (n+1)th combination of input signals that, when its previous combination was one of the n input signal combinations, its resulting output signals will remain unchanged. The logic functions realizing the above steps can be implemented in the individual devices of the latch to realize a true n-valued latch.

In view of the above description of the present invention, it will be appreciated by those skilled in the art that many variations, modifications and changes can be made to the present invention without departing from the spirit or scope of the present invention as defined by the claims appended hereto. All such variations, modifications or changes are fully contemplated by the present invention. While the invention has been described with reference to an illustrative embodiment, this description is not intended to be construed in a limiting sense.

It is also understood that the application of the present invention is focused on creating stable output signals as a result of applied logic functions. It should be clear to those skilled in the art that the conditions and requirements can be changed in such a way that the circuits of the present invention will never become stable and may therefore have a useful application as a multi-valued signal generator or multi-vibrator.

The following patent applications, including the specifications, claims and drawings, are hereby incorporated by reference herein, as if they were fully set forth herein: (1) U.S. Provisional Patent Application No. 60/575,948, filed on Jun. 1, 2004, entitled MULTI-VALUE CODING OF SEQUENCES AND MULTI-VALUE MEMORY DEVICES; (2) U.S. Provisional Patent Application No. 60/599,781, filed Aug. 7, 2004, entitled MULTI-VALUED DIGITAL INFORMATION RETAINING ELEMENTS AND MEMORY DEVICES, (3) U.S. Non-Provisional Patent Application No. 10/935,960, filed on Sep. 8, 2004, entitled TERNARY AND MULTI-VALUE DIGITAL SCRAMBLERS, DESCRAMBLERS AND SEQUENCE GENERATORS; (4) U.S. Non-Provisional Patent Application No. 11/000,218, filed Nov. 30, 2004, entitled SINGLE AND COMPOSITE BINARY AND MULTI-VALUED LOGIC FUNCTIONS FROM GATES AND INVERTERS; (5) U.S. Provisional Patent Application No. 60/646,700 filed Jan. 25, 2005, entitled MULTI-VALUED LOGIC FUNCTIONS IN LOOK-UP TABLE AND MEMORY CONFIGURATIONS.

The invention claimed is:

1. An n-valued apparatus for retaining information, comprising:
an implementation of a logical structure, the logical structure being completely determined by at least a first n-valued logic function, but by not more than 2 n-valued logic functions with feedback with n>3 in compliance with a causal switching model for producing an output signal that is stable, the first n-valued logic function including:
a first and a second input, the first input enabled to receive a first signal being in one of n states, and the second input enabled to receive a second signal being in one of p states, with $p \geq n-1$;
an output enabled to provide an output signal, the output signal being in one of p states, each state being uniquely and reversibly related to one of p states of the first signal provided on the first input; and
the second signal being dependent from the output signal.

2. The n-valued apparatus as claimed in claim 1, wherein p=n and the logical structure further comprising:
a second n-valued logic function, the second n-valued logic function having a first input, a second input and an output; wherein
the output of the first n-valued logic function is connected to the second input of the second n-valued logic function, and
the output of the second n-valued logic function is connected to the second input of the first n-valued logic function;
the first input of the first n-valued logic function being a first input of the n-valued apparatus;
the first input of the second n-valued logic function being a second input of the n-valued apparatus; and
the output of the first n-valued logic function being an output of the n-valued apparatus.

3. The n-valued apparatus as claimed in claim 2, wherein:
the second input of the n-valued apparatus is capable to receive a second n-valued signal, the second n-valued signal having a first state; and
the output of the n-valued apparatus continuing to provide the n-valued output signal that is uniquely and reversibly related to the signal on the first input of the first device when the second n-valued signal is changed from the first state to a second state.

4. The n-valued apparatus as claimed in claim 3, wherein:
the second n-valued signal is in the second state;
the first n-valued signal is put in a third of n states; and
the output of the n-valued apparatus continues to provide the n-valued output signal of claim 3 when the second n-valued signal was in the first state.

5. The n-valued apparatus as claimed in claim 4, wherein the first n-valued logic function and the second n-valued logic function are identical n-valued logic functions.

6. The n-valued apparatus as claimed in claim 1, wherein p=n−1; and
the output of the first n-valued logic function is connected to the second input of the first n-valued logic function.

7. The n-valued apparatus as claimed in claim 6, wherein the output signal does not change in state when the signal on the first input is changed from one in (n−1) states to an $n^{th}$ state.

8. The n-valued device as claimed in claim 7, further comprising a gating device including:
a first input enabled to receive a signal being in one of (n-1) states, a control input enabled to receive a signal having one of at least two states, and an output enabled to provide an output signal being in one of n states, the output of the gating device being connected to the first input of the first device and wherein:
the output of the gating device provides the signal received on the first input of the gating device when the control input receives a signal in a first state and the output of the gating device provides a signal in an nth state when the control input receives a signal not in a first state.

9. The n-valued apparatus as claimed in claim 2, wherein the first input of the second n-valued logic function is connected to the first input of the first n-valued logic function, and further comprising:
a gating device having:
a first and a second input, each capable to receive an n-valued signal;
a control input, capable to receive a signal having at least a first and a second state;
an output, enabled to provide an n-valued signal; and wherein
the output of the n-valued apparatus is connected to the second input of the gating device;
the output of the gating device is connected to the first input of the n-valued apparatus;
the first input of the gating device is conducting to the output of the gating device when the control input receives a signal in a first state; and
the second input of the gating device is conducting to the output of the gating device when the control input receives a signal not in a first state.

10. The n-valued apparatus as claimed in claim 2, wherein:
the first input of the second n-valued function is connected to the first input of the first n-valued function.

11. The n-valued apparatus as claimed in claim 10, wherein the first input of the second n-valued function is connected to the first input of the first n-valued function through a reversible n-valued inverter.

12. The n-valued apparatus as claimed in claim 1, wherein the output of the first n-valued logic function is connected with the second input of the first n-valued logic function and p=n.

13. The n-valued apparatus as claimed in claim 12, wherein the output of the first n-valued logic function is connected to the second input through a reversible n-valued inverter.

14. The n-valued device as claimed in claim 12, further comprising a gating device including:

a first input enabled to receive a signal being in one of n states, a second input being connected to the output of the first device, a control input, and an output enabled to provide an output signal being in one of n states, the output being connected to the first input of the first device, and wherein:

the output of the gating device provides the signal received on the first input of the gating device when the control input receives a signal in a first state and the output of the gating device provides the signal provided on the second input of the gating device when the control input receives a signal in a second state.

15. The n-valued device as claimed in claim 1, wherein a state of a truth table that determines the n-valued logic function is represented by an electrical signal.

16. The n-valued device as claimed in claim 1, wherein a state of a truth table that determines the n-valued logic function is represented by an optical signal.

* * * * *